United States Patent [19]

Ohta

[11] Patent Number: 5,278,561
[45] Date of Patent: Jan. 11, 1994

[54] ANALOG-TO-DIGITAL CONVERTER WITH PARALLEL WITH ANALOG SIGNAL PATHS OF UNIFORM TRANSMISSION LINES

[75] Inventor: Genichiro Ohta, Ebina, Japan

[73] Assignee: Matsushita Electric Industrial Co., Ltd., Osaka, Japan

[21] Appl. No.: 910,007

[22] Filed: Jul. 7, 1992

[30] Foreign Application Priority Data

| Jul. 16, 1991 | [JP] | Japan | 3-175358 |
| Jul. 16, 1991 | [JP] | Japan | 3-175359 |
| Jul. 16, 1991 | [JP] | Japan | 3-175360 |
| Jul. 16, 1991 | [JP] | Japan | 3-175361 |
| Jul. 16, 1991 | [JP] | Japan | 3-175362 |
| Jul. 16, 1991 | [JP] | Japan | 3-175363 |
| Jul. 16, 1991 | [JP] | Japan | 3-175364 |
| Jul. 16, 1991 | [JP] | Japan | 3-175365 |

[51] Int. Cl.$^5$ ............................ H03M 1/12
[52] U.S. Cl. ..................... 341/155; 341/159
[58] Field of Search ............... 341/118, 155, 159, 133

[56] References Cited

U.S. PATENT DOCUMENTS

| 3,610,960 | 10/1971 | Hofstein | 341/159 |
| 4,633,225 | 12/1986 | Hayashi et al. | 341/163 |
| 4,804,940 | 2/1989 | Takigawa et al. | 341/133 |
| 4,833,445 | 5/1989 | Buchele | 341/118 |

OTHER PUBLICATIONS

Millman et al., "Pulse, Digital, and Switching Waveforms", (McGraw-Hill, USA, 1965), p. 83.
Motorola MECL Integrated Circuits, Fourth Edition, Motorola Inc., USA, 1989, pp. 1-20 to 1-23.
"Analog Devices Data Book," published by Analog Devices K K., vol. 1, pp. 12-355—12-367, Jun. 1990.

Primary Examiner—Marc S. Hoff
Attorney, Agent, or Firm—Stevens, Davis, Miller & Mosher

[57] ABSTRACT

The present invention provides an analog-to-digital converter which is improved in high frequency characteristics of the analog signal input circuit. The stray capacitance possessed by the input line is dispersed and the impedance is made lower by the analog signal input line which is formed of a uniform transmission line. In other words, a first uniform transmission line to which an analog signal is inputted and having a characteristic impedance is connected with second uniform transmission lines having two kinds of characteristic impedances and each connected with a comparator group so that versatility in mask design is enhanced.

8 Claims, 36 Drawing Sheets

ANALOG-TO-DIGITAL CONVERTER WITH PARALLEL WITH ANALOG SIGNAL PATHS OF UNIFORM TRANSMISSION LINES

BACKGROUND OF THE INVENTION

The present invention relates to an analog-to-digital converter and in particular, to an analog-to-digital converter suitable for high speed operation.

The typical analog-to-digital converter suitable for high speed operation has heretofore been the flash type analog-to-digital converter. In this type of analog-to-digital converter, an analog input signal is supplied in parallel to each of 2n comparators of an n-bit analog-to-digital converter for simultaneously performing a comparison operation. If the A/D converter is of a 6 bit type, an analog input signal is supplied in parallel to, for example, the inputs of $2^6$, i.e. 64, comparators. Therefore, as the number of bits increases, the electrostatic capacitance established in the input circuits increases remarkably, causing the conversion speed to be lowered remarkably.

On the other hand, the total length of a conductor which connects the input circuits with each other causes a remarkably long delay in transmission as the number of bits increases. This gives an adverse influence to the higher speed operation of the A/D converter. Even if comparators of the A/D converter which are spaced at an average length of 100 microns are finely formed in an integrated circuit, the conductors of the 6 and 8 bit A/D converters are 6400 and 25600 microns in total length, respectively.

If it is assumed that the stray capacitance and the line inductance per one micron are 1 femtofarad and 0.1 nano henry respectively, the total static capacitance of the input circuit would be 6.4 and 25.6 pico farads and the line inductance thereof would be 640 nano henry and 2560 micro henry for 6 and 8 bit A/D converters, respectively. If the input circuit has such a high reactance, the cut-off frequency of the input circuit is as low as 100 MHz and 20 MHz. This makes it very difficult to provide an A/D converter which can be operated at a high speed.

The structure of such a conventional A/D converter will now be described. Referring now to FIG. 1, there is shown as a part of the input circuit of an A/D converter. A reference mark VIN denotes a signal input line through which a signal which will be analog-to-digital converted is transmitted; VRT denotes a comparing higher reference voltage input line; VRB denotes a comparing lower reference voltage input line; 1 denotes comparators A0, A1, A2, ... A254 and A255; 2 denotes a group of comparing reference voltage dividing resistors R; 3 denotes an encoder for encoding an output signal from each comparator into a digital signal; CLOCK IN denotes a reference clock signal input line for clocking the A/D conversion; 4 a driver circuit for supplying the clock signal to the encoder 3 and an output circuit 5; 5 the output circuit for supplying the digital output to an external circuit; OUTPUT denotes data outputs; and CST denotes an input static capacitance of each comparing circuit 1.

Referring now to FIG. 2, there is shown an example of a semiconductor mask layout of the above mentioned 8 bit flash type A/D converter. The signal input line VIN is branched into four lines for reducing the attenuation of the input signal due to filtering caused by the stray capacitance and the line inductance. The total length of each of the four branches of the signal input line VIN is shortened by arranging the comparator group 1 in four columns.

Referring now to FIG. 3, there is illustrated the signal input line VIN of the semiconductor mask layout. The signal input line VIN is branched into four branched input signal lines IN1, IN2, IN3 and IN4 which leads to an input terminal of each comparator 1. FIG. 4 shows a circuit diagram of this semiconductor mask layout.

Since the comparators which are connected to each of the branched input signal lines IN1, IN2, IN3 and IN4 are 64 in number in the above mentioned conventional A/D converter as shown in FIG. 4, the total stray capacitance of the entire signal input line VIN is not decreased although the total length of the input signal lines is a little over 6 mm. Accordingly, although the lowering of the frequency characteristics at end points of the branched input signal lines IN1, IN2, IN3 and IN4 is mitigated, loading of capacitance imposed upon the external circuit which supplies a high frequency signal to the signal input line VIN remains as very high as ever.

For example, an electrostatic capacitance of 25.6 pico farads serves as an a reactance of 62.2 ohms for a sinusoidal signal having an amplitude of one volt and a frequency of 100 MHz and consumes a high frequency current of at most 16 mA. Since the influence of the electrostatic capacitance becomes remarkable as the frequency increases, a simple calculation shows that the reactance is 6.3 ohms and the consumed high frequency current is 160 mA for the 1000 MHz sinusoidal signal.

SUMMARY OF THE INVENTION

It is an object of the present invention to provide an excellent A/D converter in which the frequency characteristics of the analog signal input circuit is improved.

In a first aspect of the present invention, there is provided an analog-to-digital converter comprising: a first uniform transmission line connected with an input terminal for receiving an analog signal to be analog-to-digital converted in which a specific characteristic impedance including that of said input terminal is maintained; M second uniform transmission lines each having one end connected with said first uniform transmissions line and having N characteristic impedances, the resultant impedance of which is equal to the characteristic impedance of said first uniform transmission line; M groups of comparators, each of the comparators having a comparing input terminal connected with a respective one of said M second uniform transmission lines and defining a port of the distributed capacitance of the one of the M second uniform transmission lines to which it is connected; a third uniform transmission line connected with the other ends of said M second uniform transmission lines and having a characteristic impedance equal tot hat of said first uniform transmission line; and a terminating resistor element having one end connected with said third uniform transmission line and another end connected with a given voltage source and having a resistance equal to the characteristic impedance of said third uniform transmission line.

The analog-to-digital converter which is provided in the first aspect of the present invention has advantages that since the stray capacitance possessed by the input line can be dispersed and can be made a constant impedance by distributing the analog signal input line, loading of capacitance imposed upon the external circuit which supplies a high frequency signal to the analog signal input line can be reduced and loading of current can be reduced even at high frequency, resulting in that a high speed conversion operation can be achieved.

In a second aspect of the present invention, there is provided an analog-to-digital converter comprising a first uniform transmission line connected with an input terminal for receiving an analog signal to be analog-to-digital converted in which a specific characteristic impedance including that of said input, terminal is maintained; M second uniform transmission lines each having one end connected with said first uniform transmission line and having N characteristic impedances, the resultant impedance of which is equal to the characteristic impedance of said first uniform transmission line; M groups of comparators, each of the comparators having a comparing input terminal connected with a respective one of said M second uniform transmission lines and defining a part of the distributed capacitance of the one of the M second uniform transmission lines to which it is connected; a third uniform transmission lien connected with the other ends of said M second uniform transmission lines and having a characteristic impedance equal tot hat of said first uniform transmission line; and a terminating resistor element having one end connected with said third uniform transmission line and another end connected with a given voltage source and having a resistance equal tot he characteristic impedance of said third uniform transmission line.

The analog-to-digital converter which is provided in the second aspect of the present invention has advantages that since the stray capacitance possessed by the input line can be dispersed and can be made a constant impedance by distributing the analog signal input line, loading of capacitance imposed upon the external circuit which supplies a high frequency signal to the analog signal input line can be reduced and loading of current can be reduced even at high frequency, resulting in that a high speed conversion operation can be achieved.

In a third aspect of the present invention, there is provided an analog-to-digital converter comprising: a first uniform transmission line connected with an input terminal for receiving an analog signal to be analog-to-digital converted in which a specific characteristic impedance including that of said input terminal is maintained; N second uniform transmission lines each having one end connected with said first uniform transmission lien and each having characteristic impedance which is N times as high as the characteristic impedance of said first uniform transmission line; a plurality of comparators, each of the comparators having a comparing input terminal connected with a respective one of said N second uniform transmission lines and defining a sort of the distributed; capacitance of the one of the N second uniform transmission lines to which it is connected and a terminating resistor element having one end connected with the other ends of said N second uniform transmission liens and the other end connected with a given voltage source, and having a resistance equal to the characteristic impedance of each of said second uniform transmission lines.

The analog-to-digital converter which is provided in the third aspect of the present invention has advantages that since the stray capacitance possessed by the input line can be dispersed and can be made a constant impedance by distributing the analog signal input line, loading of capacitance imposed upon the external circuit which supplies a high frequency signal to the analog signal input line can be reduced and loading of current can be reduced even at high frequency, resulting in that a high speed conversion operation can be achieved.

In a fourth aspect of the present invention, there is provided an analog-to-digital converter comprising: a first uniform transmission line connected with an input terminal for receiving an analog signal to be analog-to-digital converted in which a specific characteristic impedance including that of said input terminal is maintained; N second uniform transmission lines each having one end connected with said first uniform transmission line and each having a characteristic impedance which is N times as high as the characteristic impedance of said first uniform transmission line; a plurality of groups of comparators, each of the comparators having a comparing input terminal connected with a respective one of said N second uniform transmission lines and defining a part of the distributed capacitance of the one of the N second uniform transmission lines to which it is connected; and an external terminating resistor connected on one end with the other ends of said N second uniform transmission lines and connected on another end with a given voltage source and having a resistance equal to each of the characteristic impedances of said second uniform transmission line.

The analog-to-digital converter which is provided in the fourth aspect of the present invention has advantages that since the stray capacitance possessed by the input line can be dispersed and can be made a constant impedance by distributing the analog signal input line, loading of capacitance imposed upon the external circuit which supplies a high frequency signal to the analog signal input line can be reduced and loading of current can be reduced even at high frequency, resulting in that a high speed conversion operation can be achieved.

In a fifth aspect of the present invention, there is provided an analog-to-digital converter comprising: a first uniform transmission lien connected with an input terminal for receiving an analog signal to be analog-to-digital converted in which a specific characteristic impedance including that of said input terminal is maintained; N second uniform transmission lines each having one end connected with said first uniform transmission line and each having a characteristic impedance which is N times as high as the characteristic impedance of said first uniform transmission line; a plurality of groups of comparators, each of the comparators having a comparing input terminal connected with a respective one of said N second uniform transmission lines defining a part of the distributed capacitance of the one of the N second uniform transmission lines to which it is connected; a third uniform transmission line connected with the other ends of said N second uniform transmission lines and having a characteristic impedance equal to that of said first uniform transmission line; and an external terminating resistor on one and connected with said third uniform transmission line and connected on another end with a given voltage source and having a resistance equal to the characteristic impedance of said third uniform transmission line.

The analog-to-digital converter which is provided in the fifth aspect of the present invention has advantages that since the stray capacitance possessed by the input line can be dispersed and can be made a constant impedance by distributing the analog signal input line, loading of capacitance imposed upon the external circuit which supplies a high frequency signal to the analog signal input line can be reduced and loading of current can be reduced even at high frequency, resulting in that a high speed conversion operation can be achieved.

In a sixth aspect of the present invention, there is provided an analog-to-digital converter comprising: a first uniform transmission line connected with an input terminal for receiving an analog signal to be analog-to-digital converted in which a specific characteristic impedance including that of said input terminal is maintained; M second uniform transmission lines each having one end connected with said first uniform transmission line and having N characteristic impedances, the resultant impedance of which is equal to the characteristic impedance of said first uniform transmission line; M groups of comparators, each of the comparators having a comparing input terminal connected with a respective one of said M second uniform transmission lines and defining a part of the distributed capacitance of the one of the M second uniform transmission liens to which it is connected; and an external terminating resistor connected on one end with said second uniform transmission line and connected on another end with a given voltage source and having a resistance equal to the characteristic impedance of said second uniform transmission line.

The analog-to-digital converter which is provided in the sixth aspect of the present invention has advantages that since the stray capacitance possessed by the input line can be dispersed and can be made a constant impedance by distributing the analog signal input line, loading of capacitance imposed upon the external circuit which supplies a high frequency signal to the analog signal input line can be reduced and loading of current can be reduced even at high frequency, resulting in that a high speed conversion operation can be achieved.

In a seventh aspect of the present invention, there is provided an analog-to-digital converter comprising: a first uniform transmission line connected with an input terminal for receiving an analog signal to be analog-to-digital converted in which a specific characteristic impedance including that of said input terminal is maintained; M second uniform transmission lines each having one end connected with said first uniform transmission line and having N characteristic impedances, the resultant impedance of which is equal to the characteristic impedance of said first uniform transmission line; M groups of comparators, each of the comparators having a comparing input terminal connected with a respective one of said M second uniform transmission lines and defining a part of the distributed capacitance of the one of the M second uniform transmission lines to which it is connected; and a terminating resistor element having one end connected with the other ends of said M second uniform transmission lines and the other end connected with a given voltage source and having a resistance equal to each of the characteristic impedances of said second uniform transmission line.

The analog-to-digital converter which is provided in the seventh aspect of the present invention has advantages that since the stray capacitance possessed by the input line can be dispersed and can be made a constant impedance by distributing the analog signal input line, loading of capacitance imposed upon the external circuit which supplies a high frequency signal to the analog signal input line can be reduced and loading of current can be reduced even at high frequency, resulting in that a high speed conversion operation can be achieved.

In an eighth aspect of the present invention, there is provided an analog-to-digital converter comprising: a first uniform transmission line connected with an input terminal for receiving an analog signal to be analog-to-digital converted in which a specific characteristic impedance including that of said input terminal is maintained; N second uniform transmission lines each having one end connected with said first uniform transmission line and each having a characteristic impedance which is N times as, high as the characteristic impedance of said first uniform transmission line; a plurality of groups of comparators, each of the comparators having a comparing input terminal connected with a respective one of said N second uniform transmission lines and defining a part of the distributed capacitance of the one of the N second uniform transmission lines to which it is connected; a third uniform transmission line connected with the other ends of said N second uniform transmission liens and having a characteristic impedance equal tot that of said first uniform transmission line; and a terminating resistor element having one end connected with said third uniform transmission line and the other end connected with a given voltage source and having a resistance equal to the characteristic impedance of said third uniform transmission line.

The analog-to-digital converter which is provided in the eighth aspect of the present invention has advantages that since the stray capacitance possessed by the input line can be dispersed and can be made a constant impedance by distributing the analog signal input line, loading of capacitance imposed upon the external circuit which supplies a high frequency signal to the analog signal input line can be reduced and loading of current can be reduced even at high frequency, resulting in that a high speed conversion operation can be achieved.

DETAILED DESCRIPTION OF THE INVENTION

Embodiment 1

Figure 1:
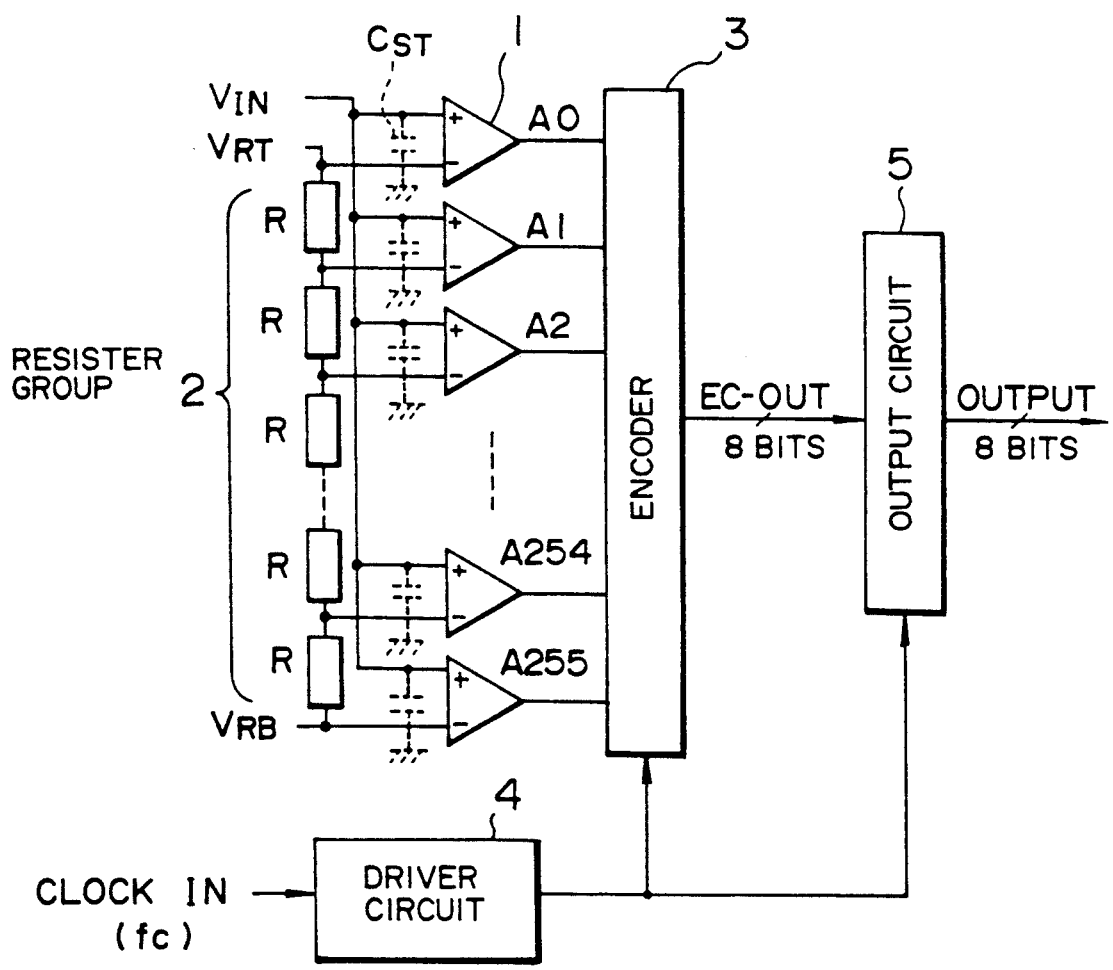
FIG. 1 is a schematic block diagram showing a prior art A/D converter.
Figure 2:
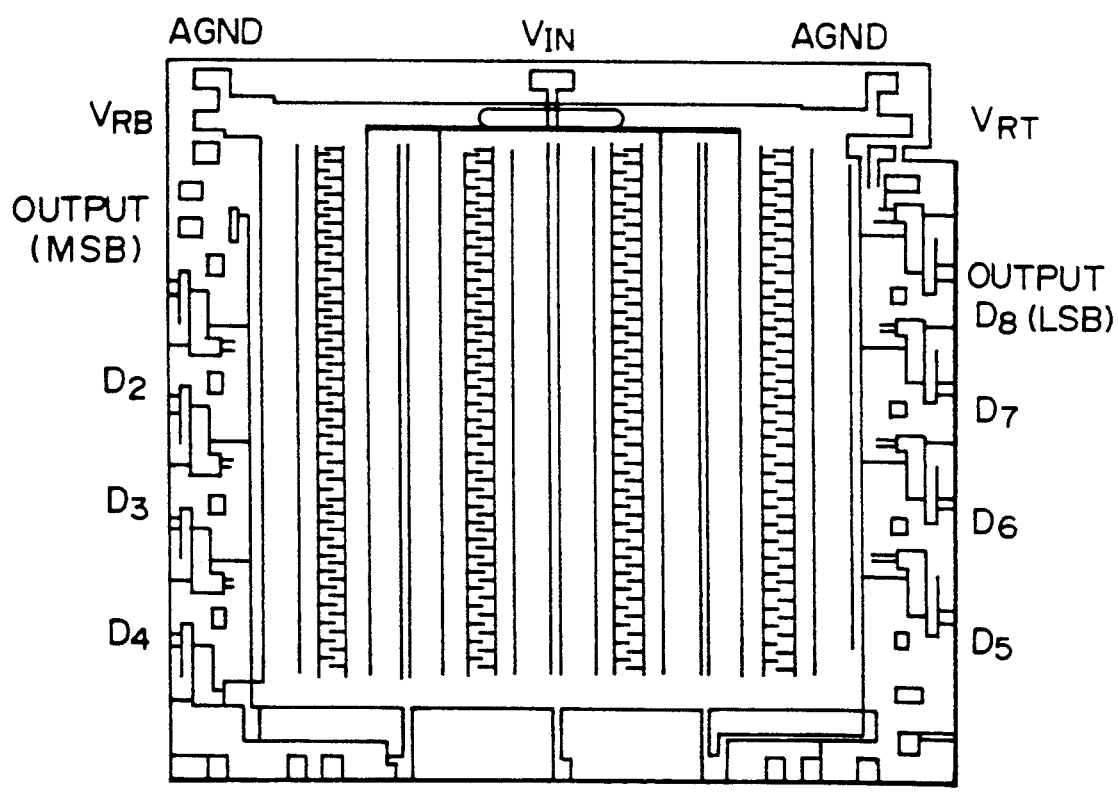
FIG. 2 is a schematic plan view showing a semiconductor mask in the prior art A/D converter of FIG. 1.
Figure 3:
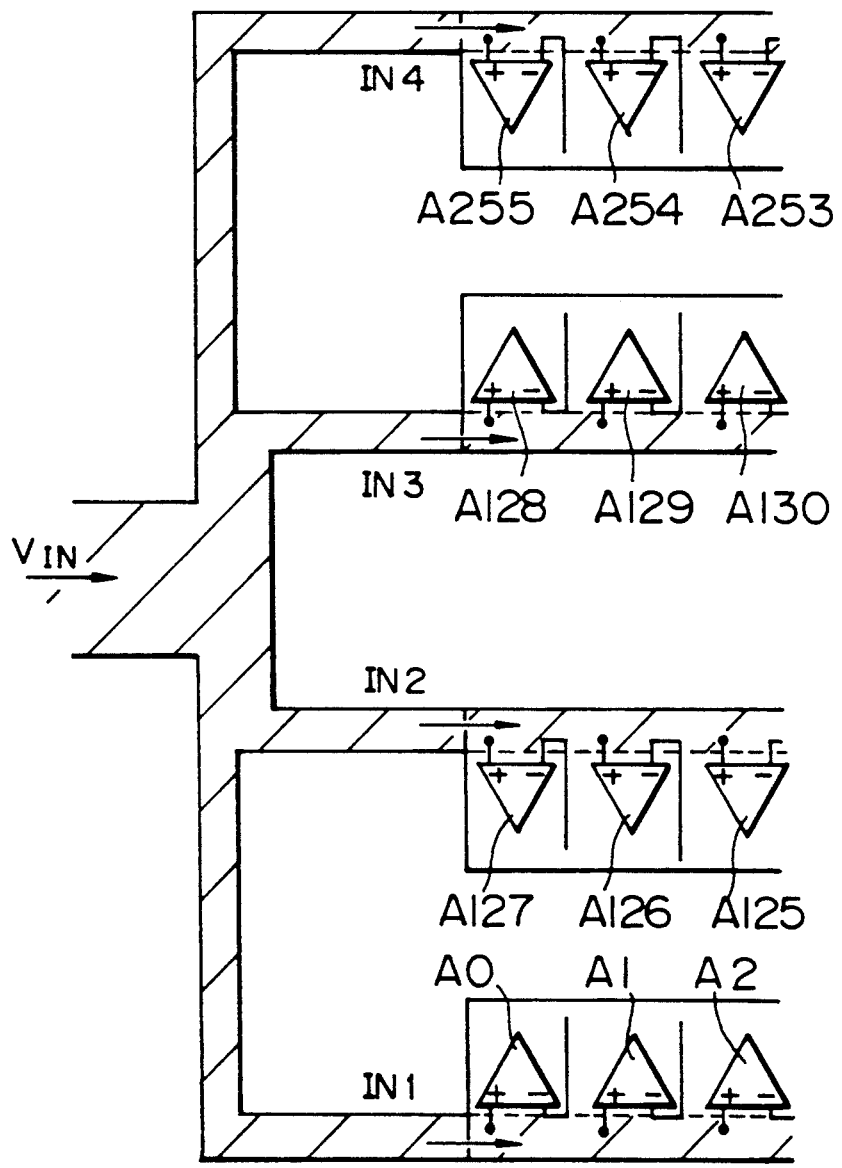
FIG. 3 is a schematic view showing the arrangement of the input side of the semiconductor mask layout in the prior art A/D converter of FIG. 1.
Figure 4:
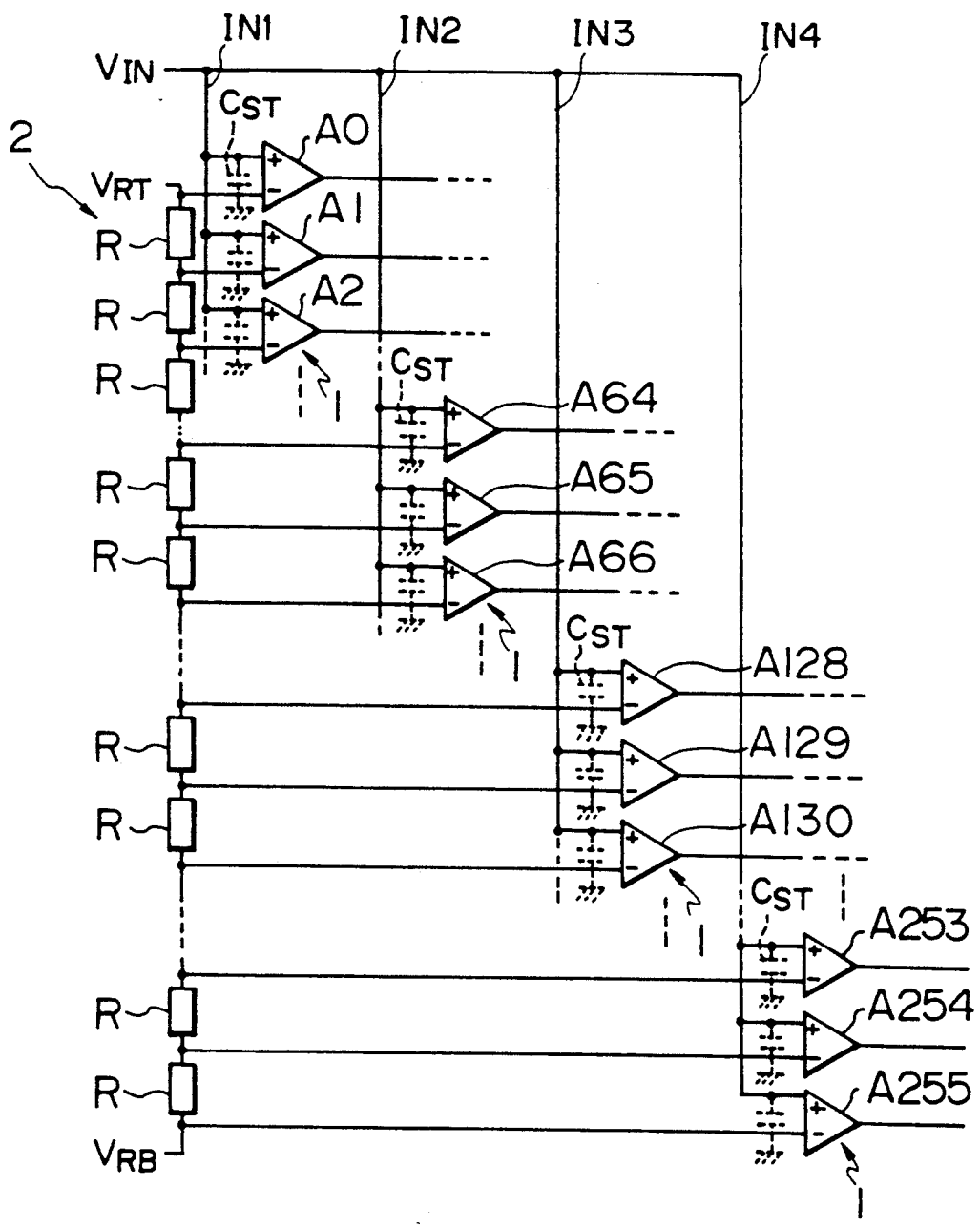
FIG. 4 is a circuit diagram showing an input of the prior art A/D converter of FIG. 1.
Figure 5:
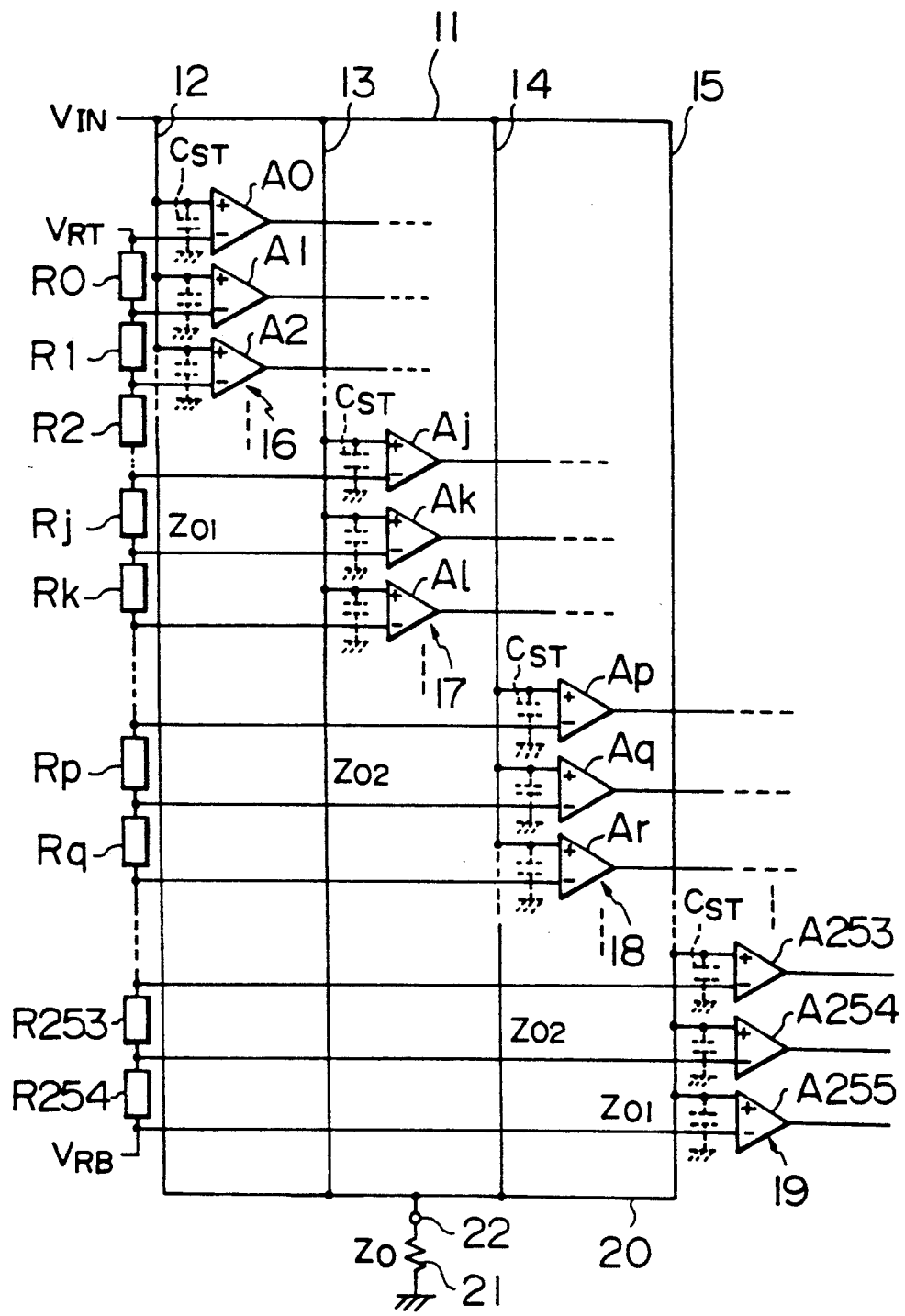
FIG. 5 is a circuit diagram showing an input portion of an embodiment of an A/D converter which is provided in the first aspect of the present invention.

Referring now to FIG. 5, there is shown the structure of an input circuit of an embodiment of an 8 bit A/D converter which is provided in the first aspect of the present invention.

In FIG. 5, a reference numeral 11 denotes a first uniform transmission line having a constant line width, which is connected with an input terminal for an analog signal to be analog-to-digital converted and in which a specific characteristic impedance $Z_0$ including that of said input terminal is maintained; reference numerals 12, 13, 14 and 15 denote four second uniform transmission lines each having one end connected with the first uniform transmission line 11 and having two kinds of characteristic impedances $Z_{01}$ and $Z_{02}$, the resultant composite impedance of which is equal to the characteristic impedance $Z_0$ of the first uniform transmission line 11; reference numerals 16, 17, 18 and 19 denote four comparing groups, each comparing input terminals thereof being connected with respective one of the four second uniform transmission lines 12, 13, 14 and 15. A reference numeral 20 denotes a third uniform transmission line connected with the other ends of the four second uniform transmission lines 12, 13, 14 and 15 and having a characteristic impedance $Z_0$ equal to that of the first uniform transmission line 11. A reference numeral 22 denotes an externally connecting terminal of the A/D converter which is connected with the third uniform transmission line 20. 21 denotes an external terminating resistance element or resistor having one end connected with the externally connecting terminal 22 and the other end connected with a given voltage source (not shown). The resistor 21 has a resistance equal to the characteristic impedance of the third uniform transmission line 20.

Figure 6:
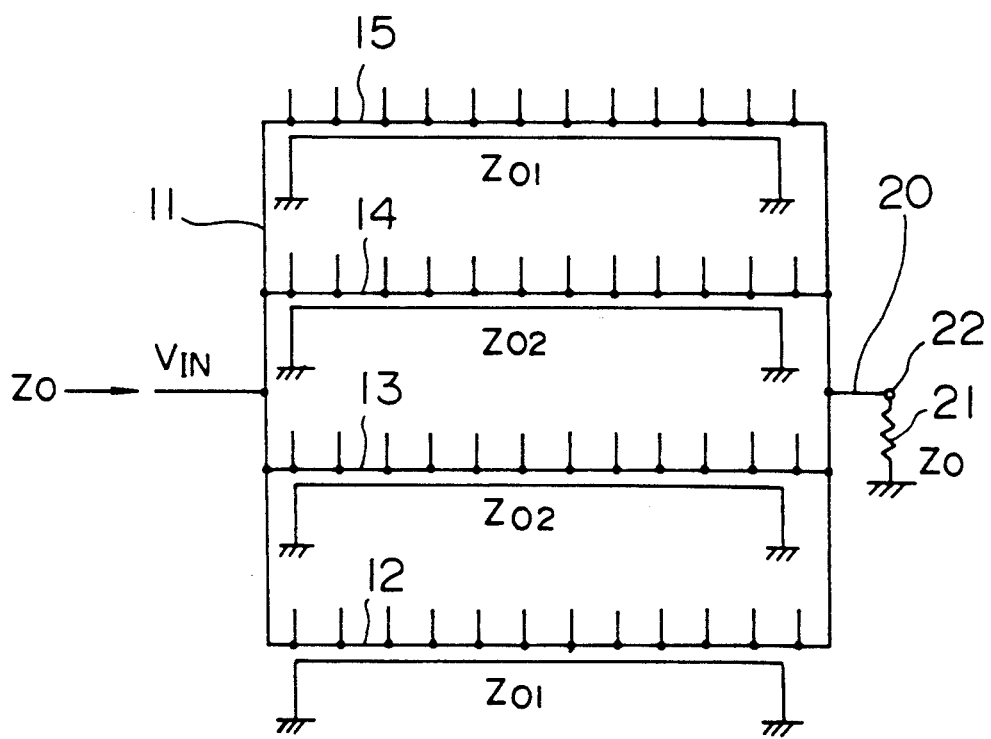
FIG. 6 is a wiring diagram showing a signal input line in the embodiment of FIG. 5.

VIN denotes a signal input line which is connected with an input terminal (not shown) to which an analog signal is applied to be analog-to-digital converted. VRT and VRB denote comparing higher and lower reference voltage input lines, respectively; $R_0$ through $R_{254}$ denote comparing reference voltage generating resistor groups; $A_0$ through $A_2$, $A_j$ through $A_l$, $A_p$ through $A_r$ and $A_{253}$ through $A_{255}$ denote comparators; CST denotes an input electrostatic capacitance of each comparator. FIG. 6 schematically shows simplified groups of the branched lines of the input line and the terminating line in the above mentioned embodiment.

Operation of the first embodiment will be described with reference to FIGS. 5 and 6. An analog signal which is inputted to the first uniform transmission line 11 having a characteristic impedance equal to a desired particular impedance $Z_0$ including that of the input terminal of the signal input line VIN will be distributed to the second uniform transmission lines 12, 13, 14 and 15 which branch from the first uniform transmission line 11 and passes therethrough. Since the resultant impedance at the branch point of the four uniform transmission lines 12, 13, 14 and 15, the lines 12 and 15 each having a characteristic impedance $Z_{01}$ and the lines 13 and 14 each having an impedance $Z_{02}$ is preset equal to the characteristic impedance $Z_0$, impedance matching at the branch point is achieved so that at least the possibility of reflection of the input signal back to the first uniform transmission line 11 is less.

Since the second uniform transmission lines 12, 13, 14 and 15 couple with the input capacitances of the comparators of each group including a quarter of the entire comparators at equal length and provides its desired characteristic impedance by including the input capacitances of the respective comparators as if each were part of the capacitance component of the uniform transmission line, stray capacitance possessed by the signal input line VIN can be distributed to each line and can be made constant, and capacitive load imposed upon an external circuit which supplies a high frequency signal to the signal input line VIN can be reduced.

If such a circuit is formed of a silicon semiconductor, the width of the lines can be made approximate to the thickness of an interlayer insulating layer when the characteristic impedance is 50 ohms since the dielectric constant is approximate to 10. In the embodiment shown in FIG. 5, the following relation is established between the characteristic impedance $Z_0$ possessed by the first uniform transmission line 11 in the signal input line VIN and two characteristic impedances $Z_{01}$ and $Z_{02}$ possessed by the second uniform transmission lines 12, 13, 14 and 15 disposed rearward of the branch point.

$$1/Z_0 = 2/Z_{01} + 2/Z_{02}$$

Generally,, the characteristic impedances of the second uniform transmission line 12, 13, 14 and 15 can be freely preset while maintaining the relation defined by the formula as follows:

$$1/Z_0 = \Sigma \ n \ (mj/Z_{0j})$$

wherein n denotes the kind of the characteristic impedance and m denotes the number of second uniform transmission lines having the same characteristic impedance.

Figure 7:
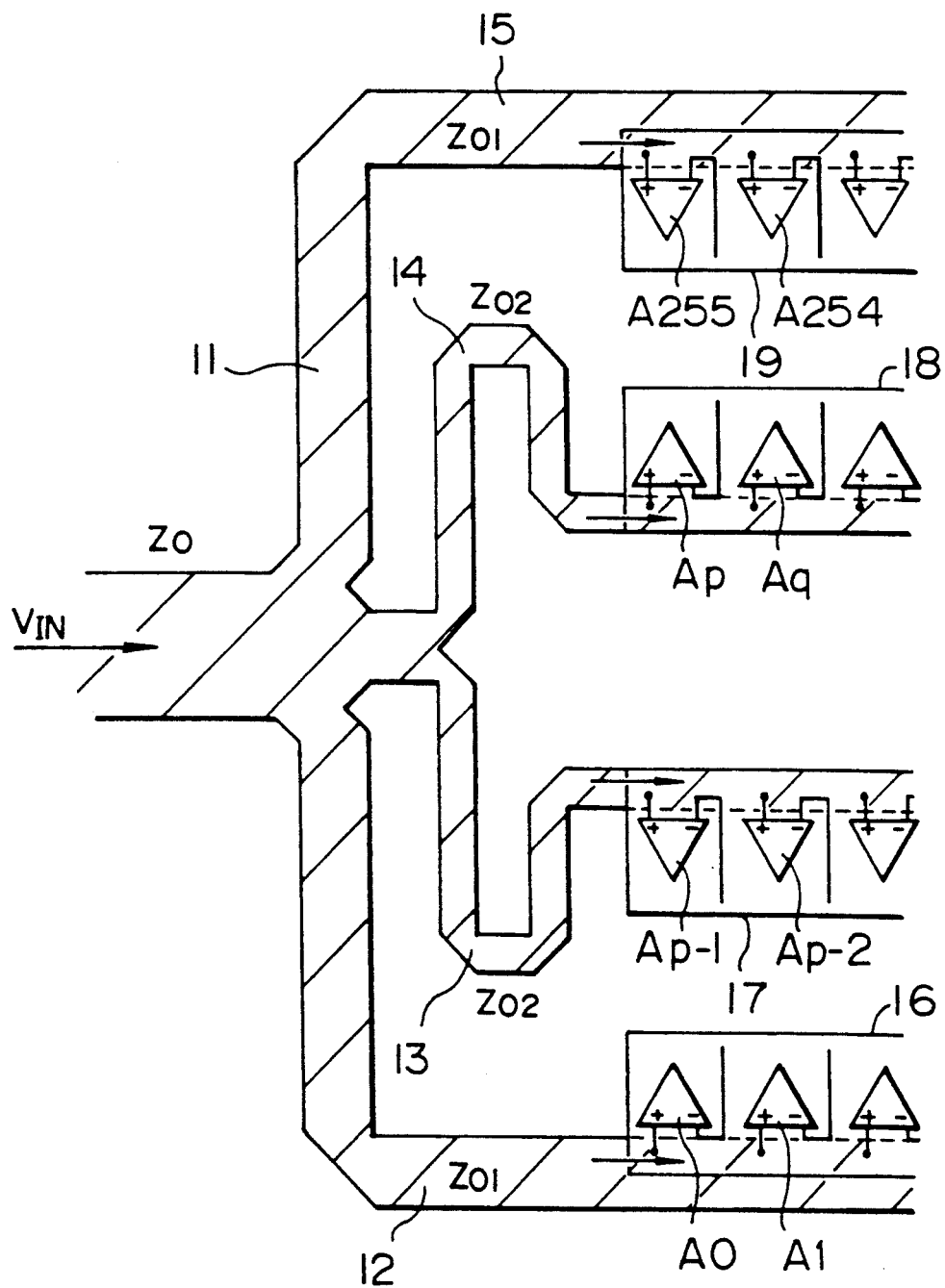
FIG. 7 is a view showing an arrangement of an input side of a semiconductor mask layout in the embodiment.
Figure 8:
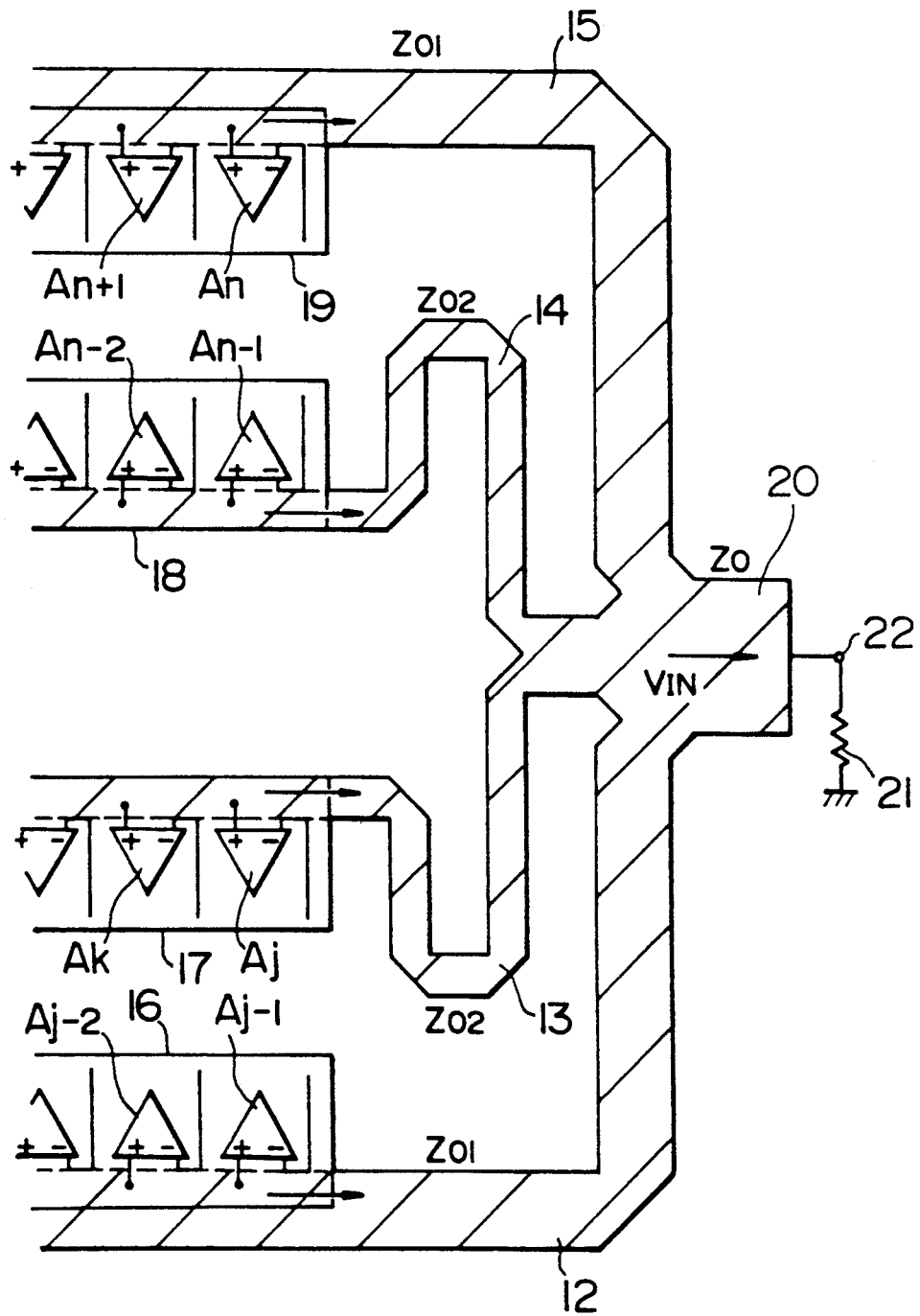
FIG. 8 is a view showing an arrangement of an output side of the semiconductor mask layout in the embodiment.

FIGS. 7 and 8 show a semiconductor mask layout of the A/D converter in the above mentioned embodiment.

By presetting the delay times caused by respective second uniform transmission lines 12, 13, 14 and 15 equal to each other, the return periods of time of the reflecting waves are matched with each other. After the input analog signal inputted to the first uniform transmission line 11 having a characteristic impedance equal to the characteristic impedance $Z_0$ has passed through the second uniform transmission lines 12, 13, 14 and 15 and the third uniform transmission line 20, it is introduced to the external terminating resistor element 21 through the externally connecting terminal 22 and is dissipated as heat by the resistor element 21. Therefore the reflected wave is suppressed.

As mentioned above, in the first embodiment of the A/D converter which is provided in the first aspect of the present invention, the input electrostatic capacitance in the analog signal input of the A/D converter which tends to become very large can be dispersed over a wide frequency range and can be changed into a given impedance. Accordingly, capacitive load imposed upon an external circuit which supplies a high frequency signal to the analog signal input line can be reduced and its load current can be small even at higher frequencies. Therefore, there are advantages that such an external circuit can be readily driven at up to higher frequencies and a high speed conversion operation can be achieved by the A/D converter. Only the resultant value of the characteristic impedances of the branched second uniform transmission lines is limited and the second individual uniform transmission lines having desired characteristic impedances can be freely provided inside of the semiconductor mask layout of the A/D converter. Therefore, there is also an advantage that the comparators can be arranged without equally distributing or disposing the comparators even if the configuration areas assigned in the integrated circuit are of modified or irregular shapes.

Embodiment 2

Figure 9:
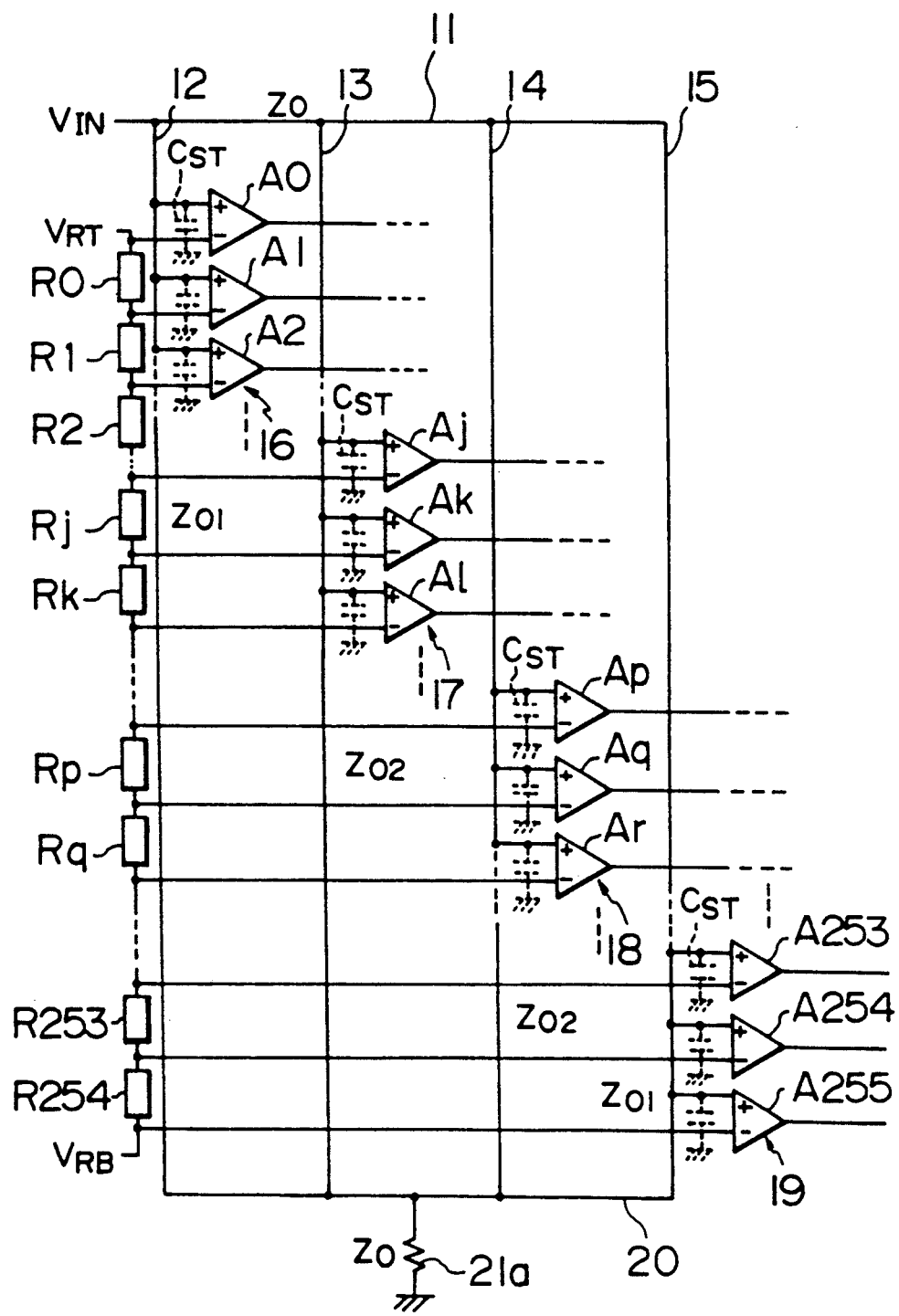
FIG. 9 is a circuit diagram showing an input portion of an embodiment of an A/D converter which is provided in the second aspect of the present invention.

Referring now to FIG. 9, there is shown the structure of an input circuit of an embodiment of an 8 bit A/D converter which is provided in the second aspect of the present invention.

Since reference numerals 11 to 20 in FIG. 9 denote like components of the first embodiment of the present invention shown in FIG. 5, description thereof will be omitted herein. 21a denotes an external terminating resistor element having one end connected with a third uniform transmission lien 20 and the other end connected with a given voltage source (not shown). The resistor 21a has a resistance equal to the characteristic impedance of the third uniform transmission line 20.

Figure 10:
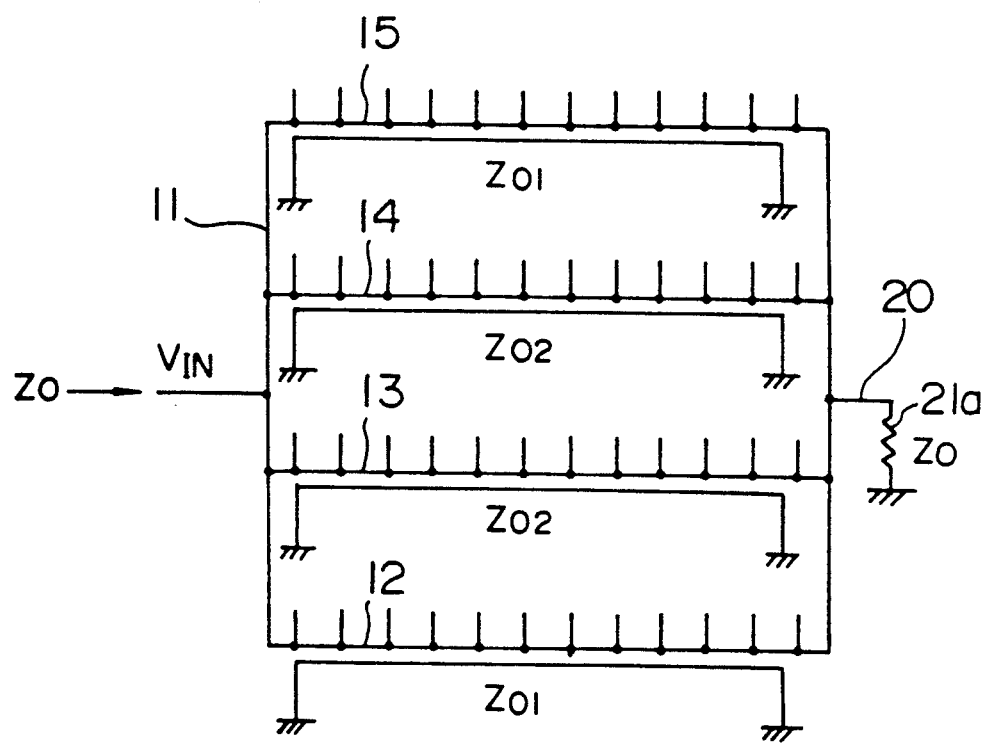
FIG. 10 is a wiring diagram showing a signal input line in the embodiment of FIG. 9.

VIN denotes a signal input line which is connected with an input terminal (not shown) to which an analog signal to be analog-to-digital converted is applied. VRT and VRB denotes comparing higher and lower reference voltage input lines, respectively; R0 through R254 denotes comparing reference voltage generating resistor groups; A0 through A2, Aj through Al, Ap through Ar and A253 through A255 denotes comparators; CST denotes an input electrostatic capacitance of each comparator. FIG. 10 schematically shows simplified groups of the branched lines of the input line and the terminating line in the above mentioned embodiment.

Operation of the second embodiment will be described with reference to FIGS. 9 and 10. An analog signal which is inputted to the first uniform transmission line 11 having a characteristic impedance equal to a desired characteristic impedance $Z_0$ including that of the input terminal of the signal input line VIN will be distributed to the second uniform transmission lines 12, 13, 14 and 15 which are connected with the first uniform transmission line 11 and passes therethrough. Since the resultant impedance at the branch point of the four uniform transmission 12, 13, 14 and 15, the lines 12 and 15 each having a characteristic impedance $Z_{01}$ and the lines 13 and 14 each having an impedance $Z_{02}$ is preset equal to the characteristic impedance Z0, impedance matching at the branch point is achieved so that at least the possibility of reflection of the input signal back to the first uniform transmission line 11 is less.

Since the second uniform transmission lines 12, 13, 14 and 15 couple with each other the input capacitances of the comparators of each group including a quarter of the entire comparators at equal length and provides a characteristic impedance which each of lines 12, 13, 14 and 15 desires while each line includes the input capacitances of the comparators as if it were a part of the capacitance of the uniform transmission line, the stray capacitance which is possessed by the signal input line VIN can be distributed to each line and can be made constant, and loading of the capacitance imposed upon the external circuit which supplies a high frequency signal to the signal input line VIN can be reduced.

If such a circuit is formed of a silicon semiconductor, the width of the lines can be made approximate to the thickness of an interlayer insulating layer when the characteristic impedance is 50 ohms since the dielectric constant is approximate to 10. In the embodiment shown in FIG. 9, the following relation is established between the characteristic, impedance $Z_0$ possessed by the first uniform transmission line 11 in the signal input line VIN and two characteristic impedances $Z_{01}$ and $Z_{02}$ possessed by the second uniform transmission lines 12, 13, 14 and 15 disposed rearward of the branch point.

$$1/Z_0 = 2/Z_{01} + 2/Z_{02}$$

Generally, the characteristic impedances of the second uniform transmission lines 12, 13, 14 and 15 can be freely preset while maintaining the relation defined by the formula as follows:

$$1/Z_0 = \Sigma\, n\, (mj/Z_{0j})$$

wherein n denotes the kind of the characteristic impedance and m denotes the number of second uniform transmission lines having the same characteristic impedance.

Figure 11:
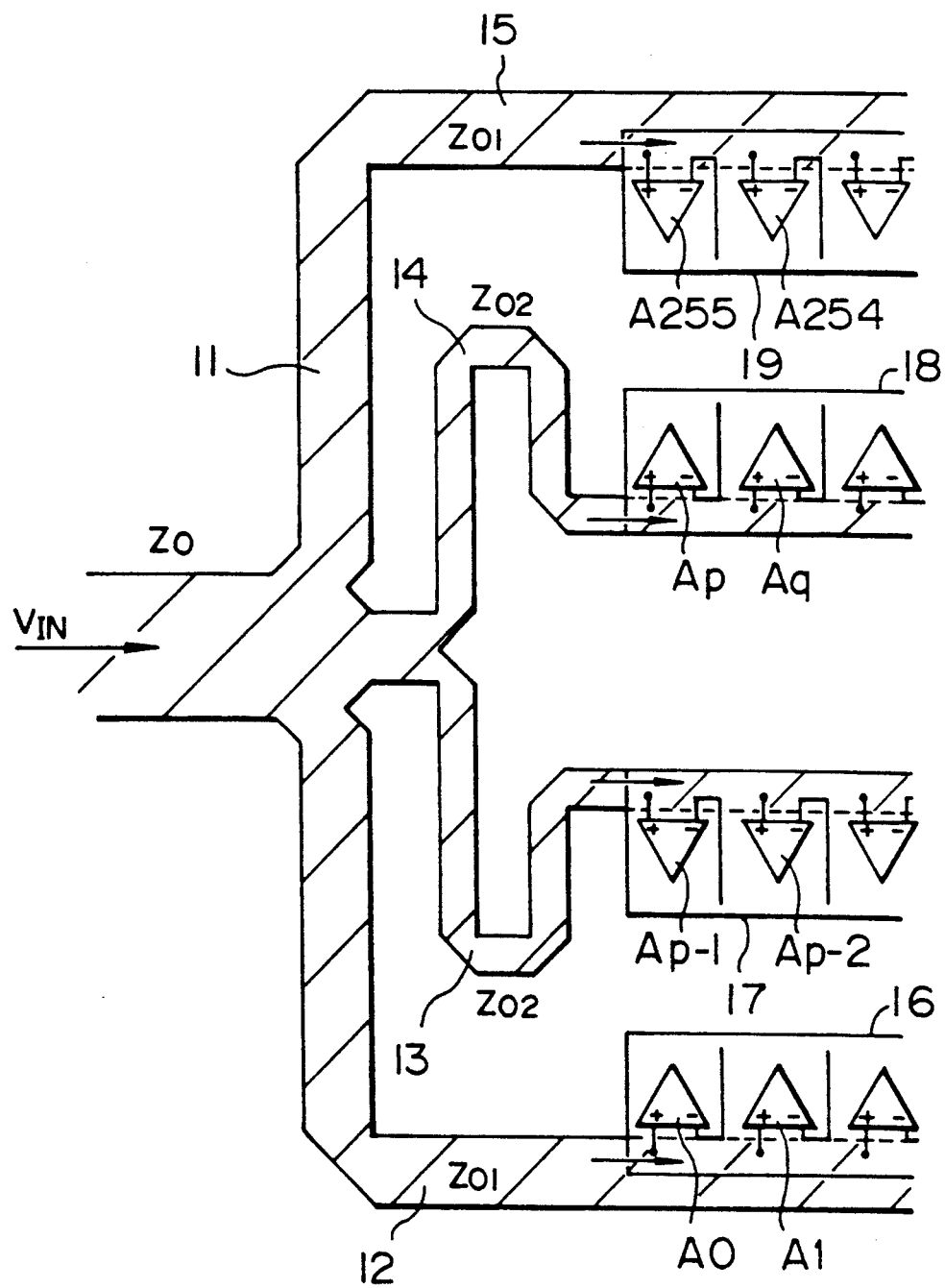
FIG. 11 is a view showing an arrangement of an input side of a semiconductor mask layout in the embodiment.
Figure 12:
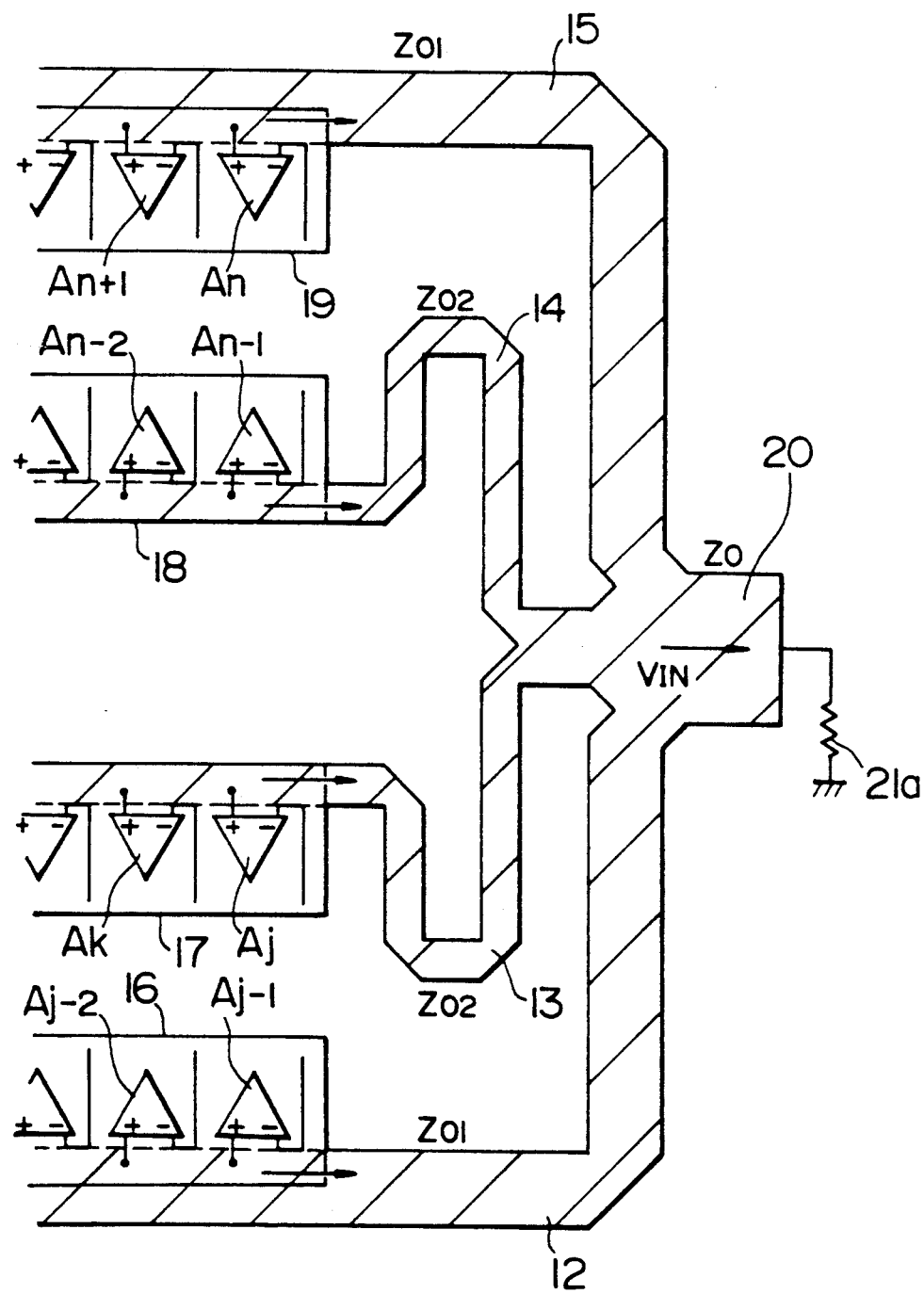
FIG. 12 is a view showing an arrangement of an output side of the semiconductor mask layout in the embodiment.

FIGS. 11 and 12 show a semiconductor mask layout of the A/D converter in the above mentioned embodiment.

By presetting the delay times caused by respective second uniform transmission lines 12, 13, 14 and 15 equal to each other, the return periods of time of the reflecting waves are matched with each other. After the input analog signal inputted to the first uniform transmission line 11 having a characteristic impedance equal to the characteristic impedance $Z_0$ has passed through the second uniform transmission lines 12/ 13, 14 and 15 and the third uniform transmission line 20, it is introduced to the external terminating resistor element 21 through the externally connecting terminal 22 and is dissipated as heat by the resistor element 21. Therefore, the reflected wave is suppressed.

As mentioned above, in the second embodiment of the A/D converter which is provided in the first aspect of the present invention, the input electrostatic capacitance in the analog signal input of the A/D converter which tends to become very high can be dispersed over a wide frequency range and can be changed into a given impedance. Accordingly, the loading of the capacitance imposed upon an external circuit which supplies a high frequency signal to the analog signal input line can be reduced and the current loading can be reduced even at higher frequencies. Therefore, there are advantages that an external circuit can be readily driven at up to higher frequency and the high speed conversion operation can be achieved by the A/D converter. Only the resultant value of the characteristic impedances of the branched second uniform transmission lines is limited and the second individual uniform transmission lines having desired characteristic impedances can be freely provided inside of the semiconductor mask layout of the A/D converter. Therefore, there is also an advantage that the comparators can be arranged without equally distributing the comparators even if the configuration of the area assigned for the comparators is modified.

Embodiment 3

Figure 13:
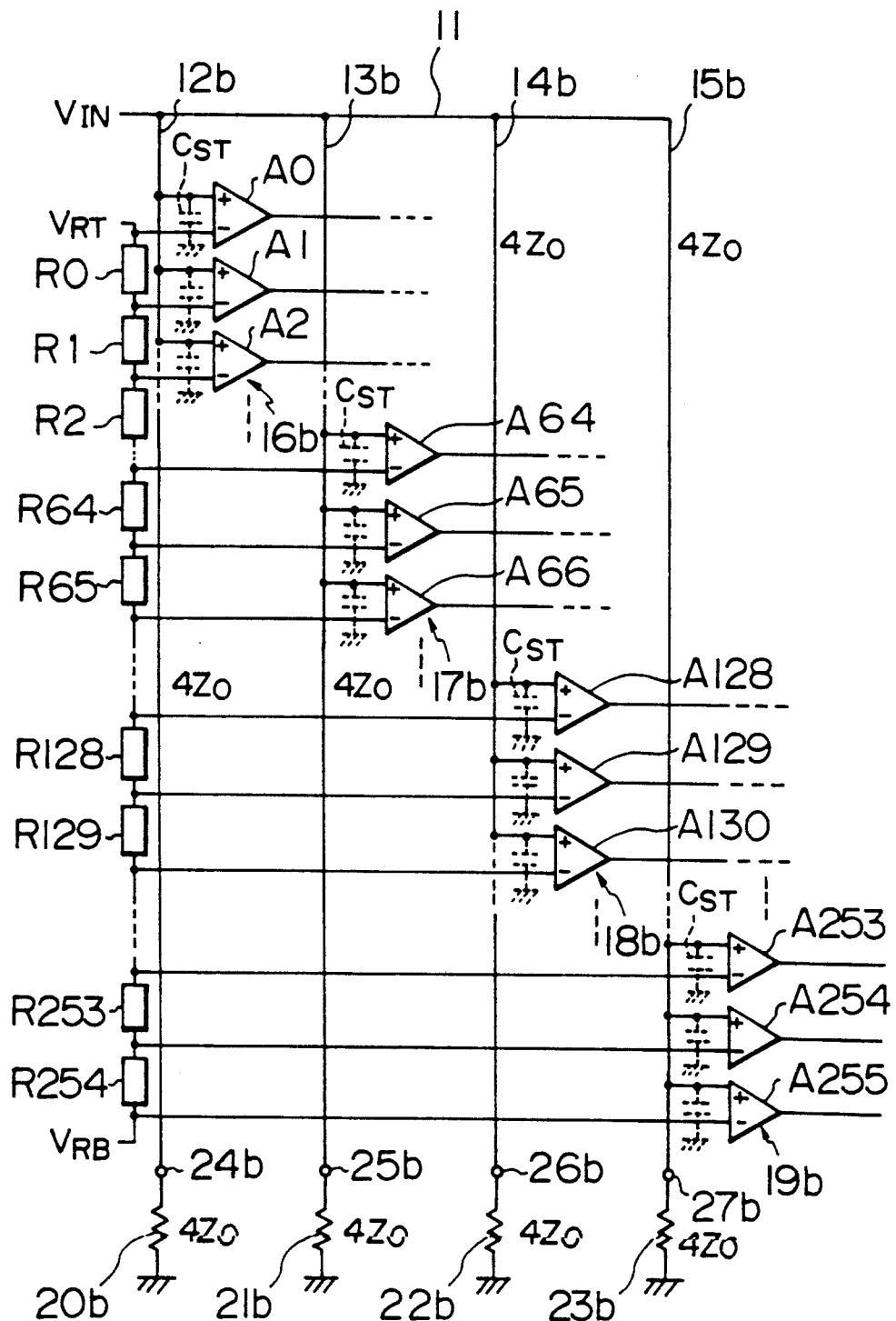
FIG. 13 is a circuit diagram showing an input portion of an embodiment of an A/D converter which is provided in the third aspect of the present invention.

Referring now to FIG. 13, there is shown the structure of an input circuit of an embodiment of 8 bit A/D converter which is provided in the third aspect of the present invention.

In FIG. 13, a reference numeral 11 denotes a first uniform transmission line having a constant line width, which is connected with an input terminal for an analog signal to be analog-to-digital converted and in which a specific characteristic impedance $Z_0$ including that of said input terminal is maintained; reference numerals 12b, 13b, 14b and 15b denote four second uniform transmission lines each having one end connected with the first uniform transmission line 11 and having two characteristic impedances $4Z_0$ which is four times as high as the impedance $Z_0$, the resultant impedance of which is equal, to the characteristic impedance $Z_0$ of the first uniform transmission line 11; reference numerals 16b, 17b, 18b and 19b denote four comparator groups, each input terminals thereof being connected with respective one of the four second uniform transmission lines 12b, 13b, 14b and 15b. Reference numerals 20b, 21b 22b and 23b denote external terminating resistor elements having one end connected with the externally connecting terminals 24b, 25b, 26b and 27b, and the other end connected with a given voltage source (not shown). The resistors 20b, 21b, 22b and 23b each has a resistance equal to the characteristic impedance $4Z_0$ of the second uniform transmission lines 12b, 13b, 14b and 15b, respectively.

Figure 14:
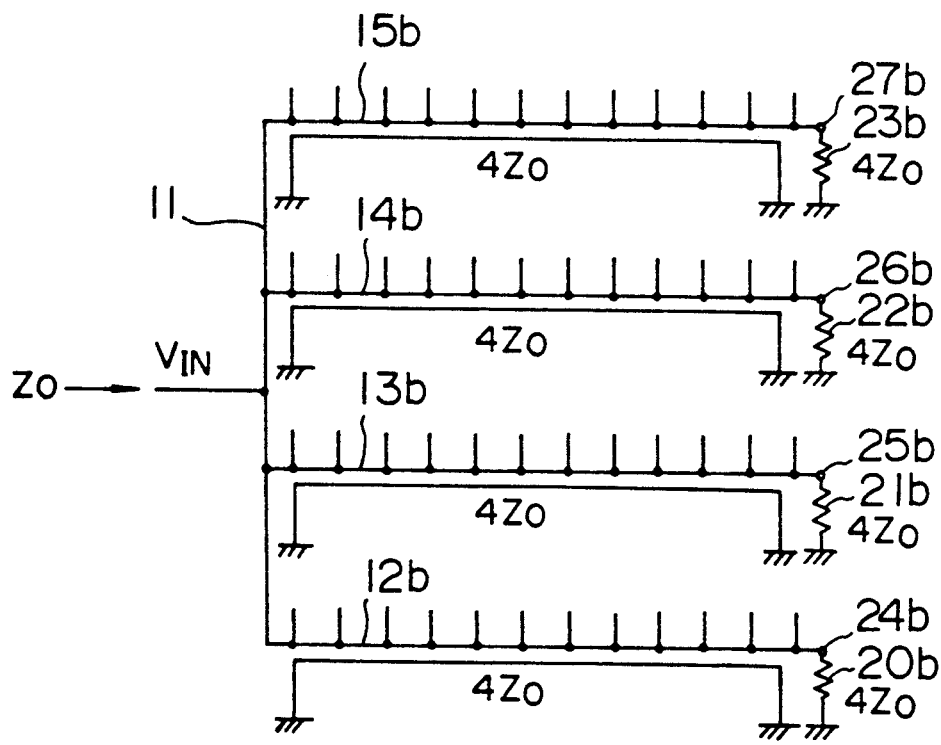
FIG. 14 is a wiring diagram showing a signal input line in the embodiment of FIG. 13.

VIN denotes a signal input line which is connected with an input terminal (not shown) to which an analog signal to be analog-to-digital converted is applied. VRT and VRB denote comparing higher and lower reference voltage input lines, respectively; R0 through R254 denote comparing reference voltage generating resistor groups; A0 through A2, A64 through A66, A128 through A130 and A253 through A255 denote comparators; CST denotes an input electrostatic capacitance of each comparator. FIG. 14 schematically shows simplified groups of the branched lines of the input line and the terminating line in the above mentioned embodiment.

Operation of the third embodiment will be described with reference to FIGS. 13 and 14. An analog signal which is inputted to the first uniform transmission line 11 having a characteristic impedance equal to a desired characteristic impedance $Z_0$ including that of the input terminal of the signal input lien VIN will be distributed to the second uniform transmission lines 12b, 13b, 14b and 15b which are connected with the first uniform transmission line 11 and passes therethrough. Since the resultant impedance at the branch point of the four uniform transmission liens 12b, 13b, 14b and 15b, the lines 12 and 15 each having a characteristic impedance $4Z_0$ is preset equal to the characteristic impedance $Z_0$, impedance matching at the branch pint is achieved so that at lest the possibility of refection of the input signal back tot he first uniform transmission line 11 is less. Since the second uniform transmission liens 12b, 13b, 14b and 15b couple with each other the input capacitance of the comparators of each group including a quarter of the entire comparators at equal length and provides a characteristic impedance $4Z_0$ which is four times as high as the characteristic impedance $Z_0$ while each line includes the input capacitances of the comparators as if it were a part of the capacitance of the uniform transmission line, the stray capacitance which is possessed by the signal input lien VIN can be distributed to each line and can be made constant, and loading of the capacity imposed upon the external circuit which supplies a high frequency signal tot he signal input line VIN can be reduced.

If such a circuit is formed of a silicon semiconductor, the width of the lines can be made approximate to the thickness of an interlayer insulating layer when the characteristic impedance is 50 ohms since the dielectric constant is approximately 10.

Figure 15:
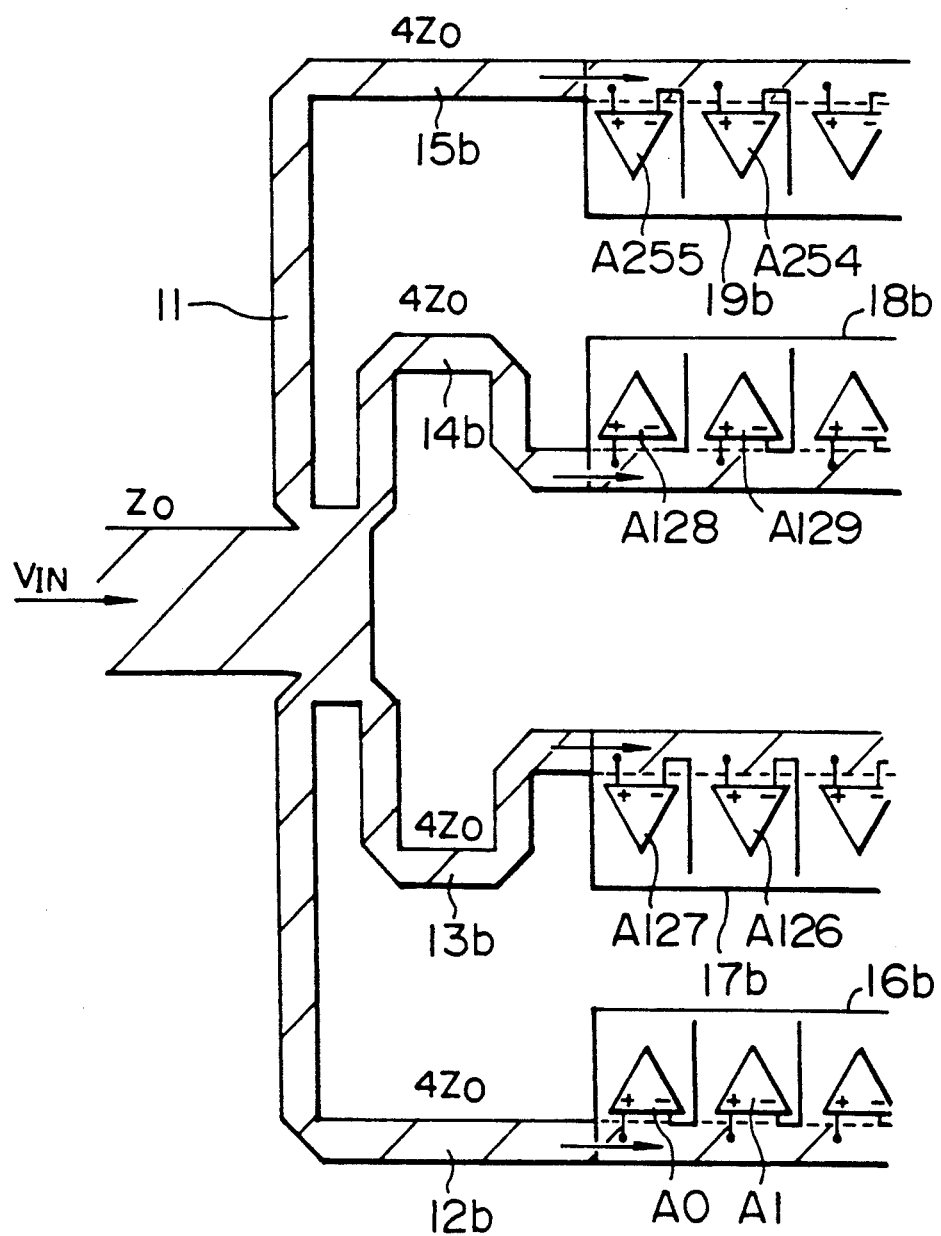
FIG. 15 is a view showing an arrangement of an input side of a semiconductor mask layout in the embodiment.
Figure 16:
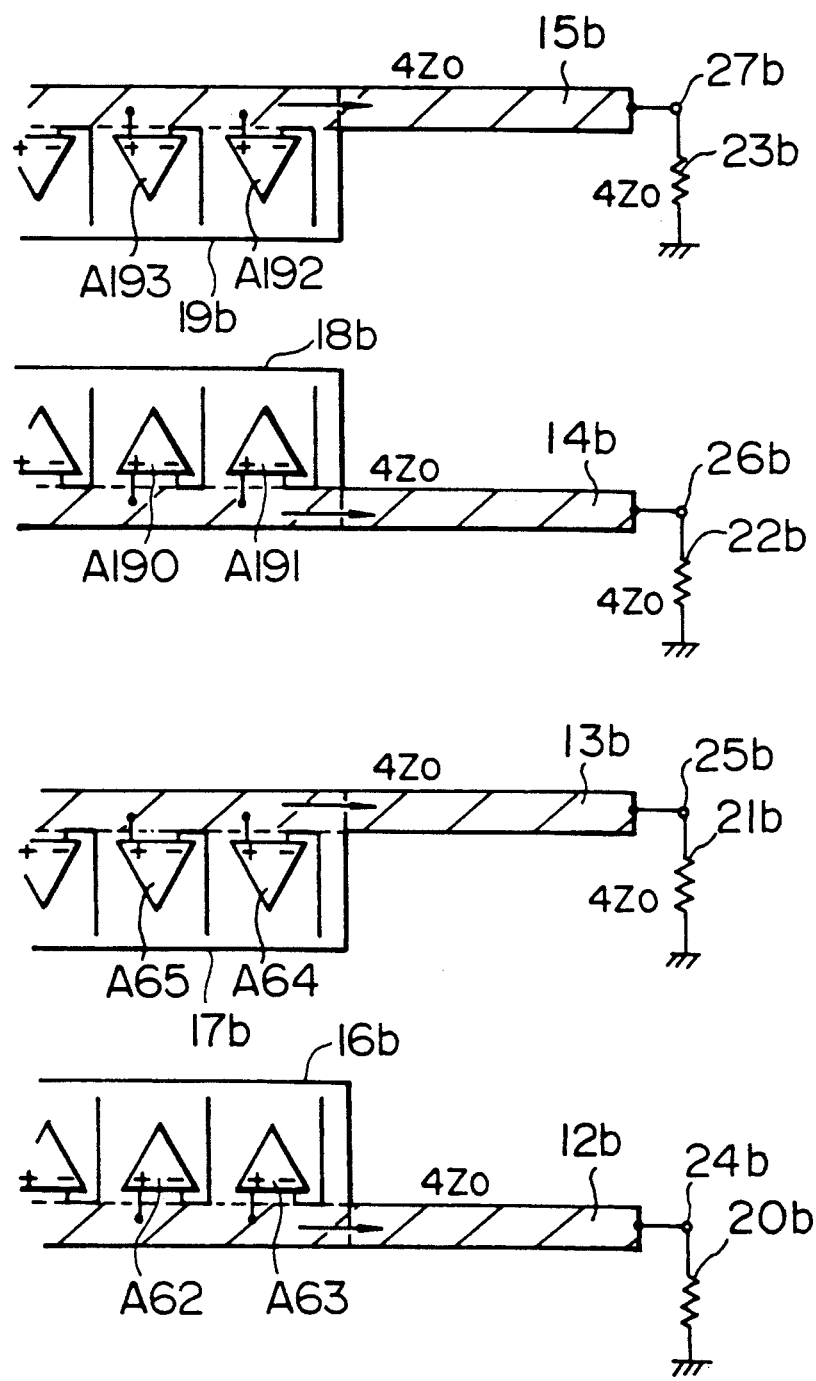
FIG. 16 is a view showing an arrangement of an output side of the semiconductor mask layout in the embodiment.

FIGS. 15 and 16 show a semiconductor mask layout of the A/D converter in the above mentioned embodiment. The circuit is very excellent in symmetry.

By presetting the delay times caused by respective second uniform transmission lines 12b, 13b, 14b and 15b equal to each other, the return periods of time of the reflecting waves are matched with each other. After the input analog signal inputted to the first uniform transmission line 11 having an energy corresponding to the impedance $4Z_0$, which is divided by the second uniform transmission lines 12b, 13b, 14b and 15b has passed through the second uniform transmission lines 12b, 13b, 14b and 15b, it is introduced to the external terminating resistor elements 20b, 21b, 22b and 23b and is dissipated as heat by the resistor elements, respectively. Therefore, the reflected wave is suppressed.

As mentioned above, in the embodiment of the A/D converter which is provided in the third aspect of the present invention, the input electrostatic capacitance in the analog signal input of the A/D converter which tends to become very high can be dispersed over a wide frequency range and can be changed into a given impedance. Accordingly, the loading of the capacitance imposed upon an external circuit which supplies a high frequency signal to the analog signal input line can be reduced and the current loading can be reduced even at higher frequencies. Therefore, there are advantages that an external circuit can be readily driven at up to higher frequency and the high speed conversion operation can be achieved by the A/D converter. Only the resultant value of the characteristic impedances of the branched second uniform transmission lines is limited and the second individual uniform transmission lines having desired characteristic impedances can be freely provided inside of the semiconductor mask layout of the A/D converter. Therefore, there is also an advantage that the comparators can be arranged without equally distributing the comparators even if the configuration of the area assigned for the comparators is modified.

The terminals of the second uniform transmission lines comprise individually independent resistor elements the lengths of the branched second uniform transmission lines should not be necessarily the same in mask design. Therefore, there is also advantage that the freedom degree to design is high. Furthermore, since a terminating resistor element can be connected externally of the A/D converter via an externally connecting terminal, impedance matching can be accurately adjusted. Power consumption and heat dissipation in the external terminating resistor element can be designed independently of the design of the A/D converter. Therefore, there is also an advantage that the reliability of the A/D converter can be enhanced.

Embodiment 4

Figure 17:
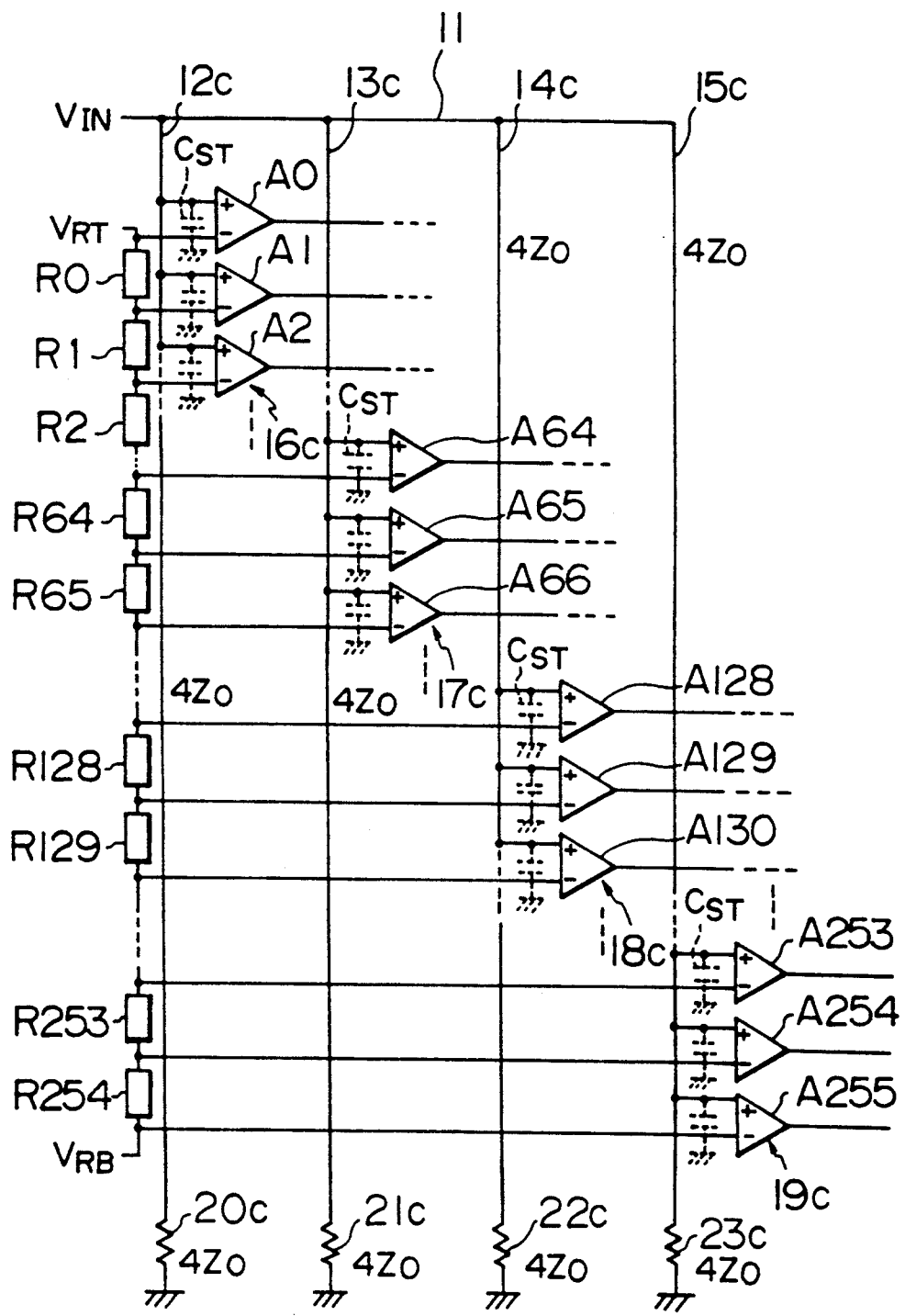
FIG. 17 is a circuit diagram showing an input portion of an embodiment of an A/D converter which is provided in the fourth aspect of the present invention.

Referring now to FIG. 17, there is shown the structure of an input circuit of an embodiment of an 8 bit A/D converter which is provided in the fourth aspect of the present invention.

In FIG. 17, a reference numeral 11 denotes a first uniform transmission line having a constant line width, which is connected with an input terminal for an analog signal to be analog-to-digital converted and in which a specific characteristic impedance $Z_0$ including that of said input terminal is maintained; reference numerals 12c, 13c, 14c and 15c denote four second uniform transmission lines each having one end connected with the first uniform transmission line 11 and having two characteristic impedances $4Z_0$ which is four times as high as the impedance $Z_0$, the resultant impedance of which is equal to the characteristic, impedance $Z_0$ of the first uniform transmission line 11; reference numerals 16c, 17c, 18c and 19c denote four comparator groups, each input terminals thereof being connected with respective one of the four second uniform transmission lines 12c, 13c, 14c and 15c. Reference numerals 20c, 21c, 22c and 23c denote external terminating resistor elements having one end connected with the four second lines 12c, 13c, 14c and 15c, respectively, and the other end connected with a given voltage source (not shown). The resistors 20c, 21c, 22c and 23c each has a resistance equal to the characteristic impedance of $4Z_0$ of the second uniform transmission lines 12c, 13c, 14c and 15c, respectively.

Figure 20:
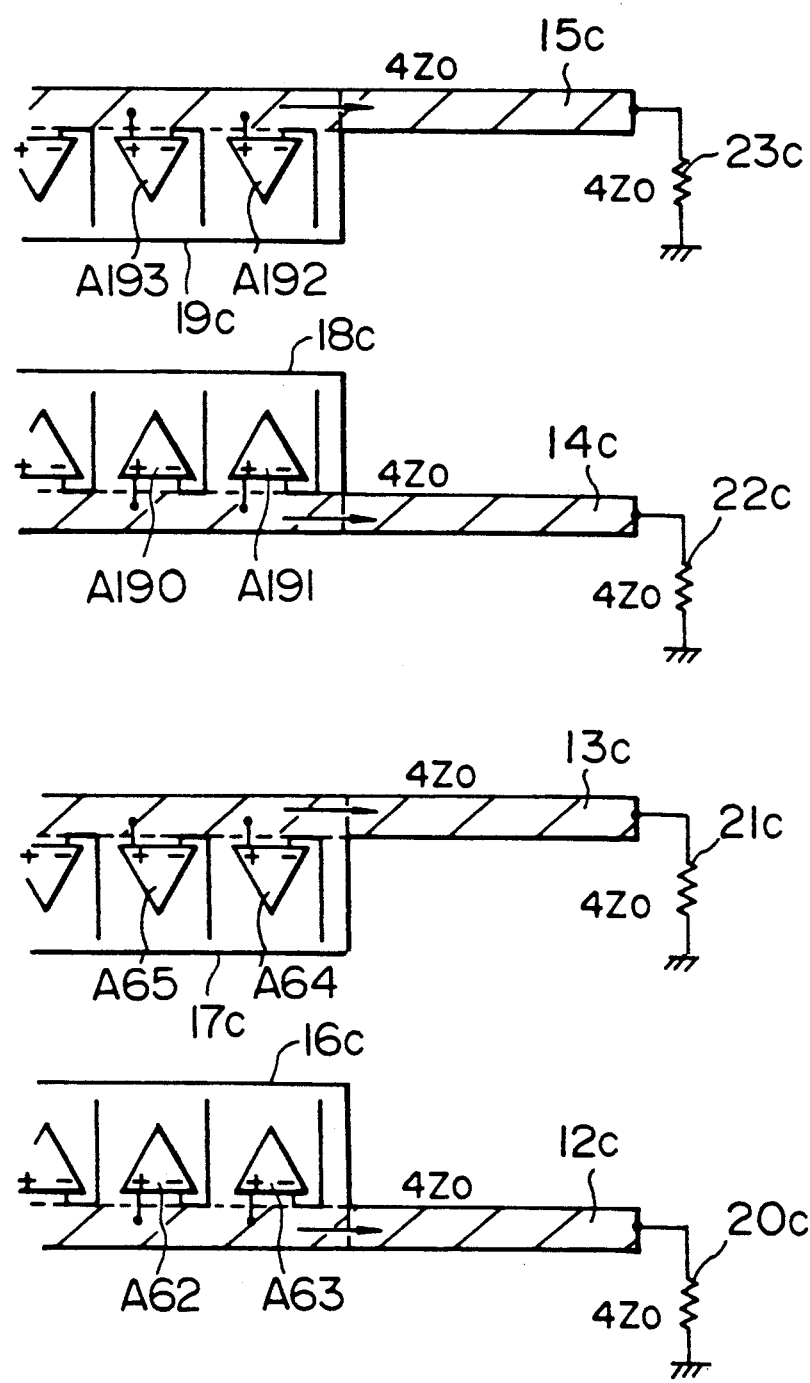
FIG. 20 is a view showing an arrangement of an output side of the semiconductor mask layout in the embodiment.

VIN denotes a signal input line which is connected with an input terminal (not shown) to which an analog signal to be analog-to-digital converted is applied. VRT and VRB denote comparing higher and lower reference voltage input lines, respectively; R0 through R254 denote comparing reference voltage generating resistor groups; A0 through A2, A64 through A66, A128 through A130 and A253 through A255 denote comparators; CST denotes an input electrostatic capacitance of each comparator. FIG. 20 schematically shows simplified group of the branched lines of the input line and the terminating line in the embodiment.

Figure 18:
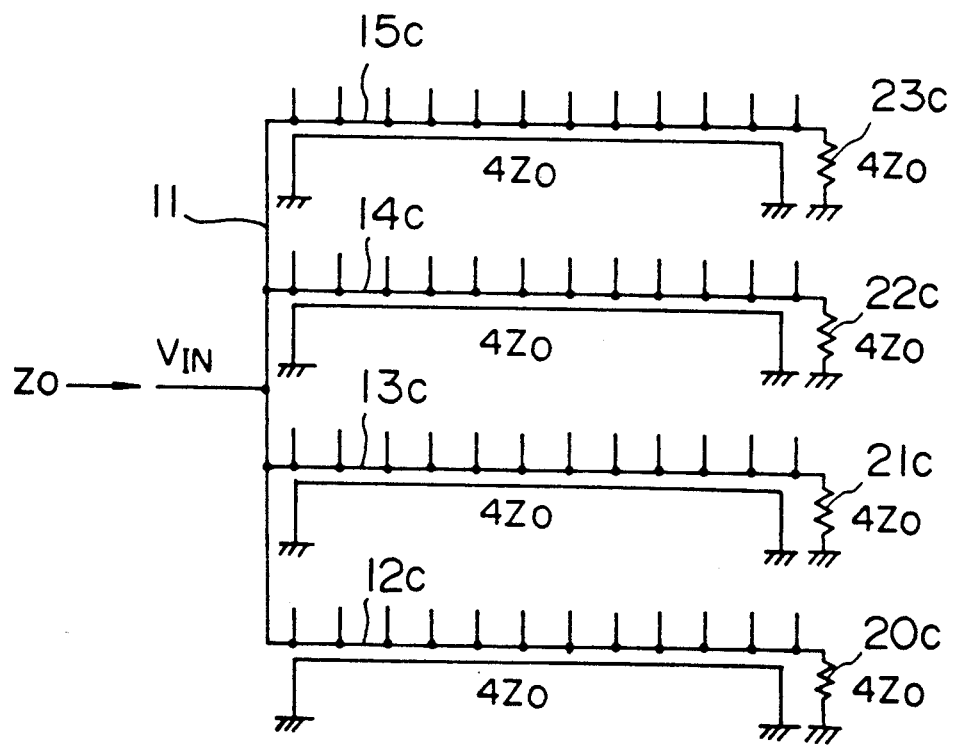
FIG. 18 is a wiring diagram showing a signal input line in the embodiment of FIG. 17.

Operation of the fourth embodiment will be described with reference to FIGS. 17 and 18. An analog signal which is inputted to the first uniform transmission line 11 having a characteristic impedance equal to a desired characteristic impedance $Z_0$ including that of the input terminal of the signal input line VIN will be distributed to the second uniform transmission lines 12c, 13c, 14c and 15c which are connected with the first uniform transmission line 11 and passes therethrough. Since the resultant impedance at the branch point of the four uniform transmission lines 12c, 13c, 14c and 15c, the lines 12 and 15 each having a characteristic impedance $4Z_0$ is preset equal to the characteristic impedance $Z_0$, impedance matching at the branch point is achieved so that at least the possibility of reflection of the input signal back to the first uniform transmission line 11 is less.

Since the second uniform transmission lines 12c, 13c, 14c and 15c couple with each other the input capacitances of the comparators of each group including a quarter of the entire comparators at equal length and provides a characteristic impedance $4Z_0$ which is four times as high as the characteristic impedance $Z_0$ while each line includes the input capacitances of the comparators as if it were a part of the capacitance of the uniform transmission line, the stray capacitance which is possessed by the signal input line VIN be distributed to each line and can be made constant, and loading of the capacitance imposed upon the external circuit which supplies a high frequency signal to the signal input line VIN can be reduced.

If such a circuit is formed of a silicon semiconductor, the width of the lines can be made approximate to the thickness of an interlayer insulating layer when the characteristic impedance is 50 ohms since the dielectric constant is approximate to 10.

Figure 19:
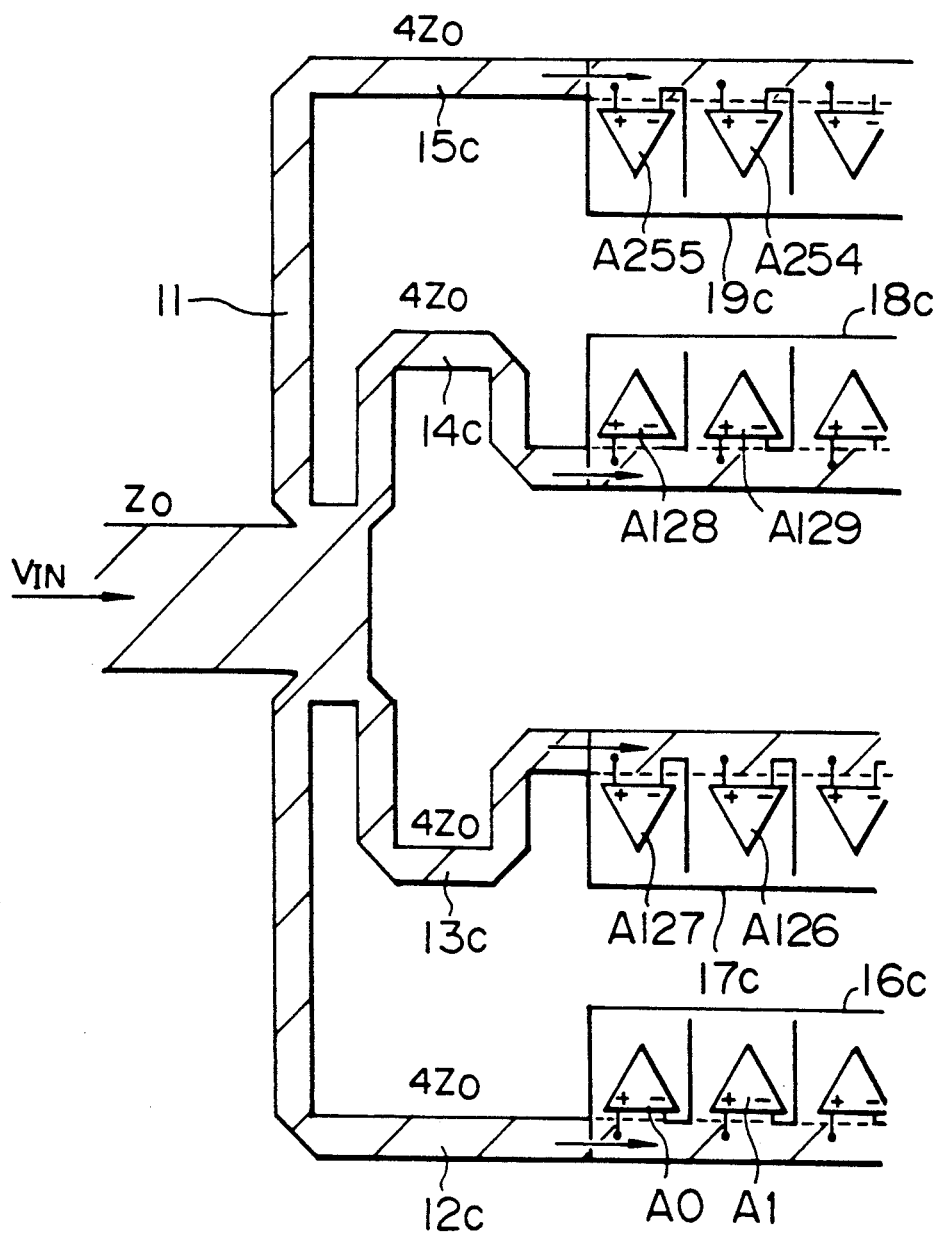
FIG. 19 is a view showing an arrangement of an input side of a semiconductor mask layout in the embodiment.

FIGS. 19 and 20 show a semiconductor mask layout of the A/D converter in the above mentioned embodiment. The circuit is very excellent in symmetry.

By presetting the delay times caused by respective second uniform transmission lines 12c, 13c, 14c and 15c equal to each other, the return periods of time of the reflecting waves are matched with each other. After the input analog signal inputted to the first distributed constant line 11 having an energy corresponding to the impedance $4Z_0$, which is divided by the second uniform transmission lines 12c, 13c, 14c and 15c has passed through the second distributed constant lines 12c, 13c, 14c and 15c, it is introduced to the external terminating resistor elements 20c, 21c, 22c and 23c and is dissipated as heat by the resistor elements, respectively. Therefore the reflected wave is suppressed.

As mentioned above, in the embodiment of the A/D converter which is provided in the fourth aspect of the present invention, the input electrostatic capacitance in the analog signal input of the A/D converter which tends to become very high can be dispersed over a wide frequency range and can be changed into a given impedance. Accordingly, the loading of the capacitance imposed upon an external circuit which supplies a high frequency signal to the analog signal input line can be reduced and the current loading can be reduced even at higher frequencies. Therefore, there are advantages that an external circuit can be readily driven at up to higher frequency and the high speed conversion operation can be achieved by the A/D converter. Only the resultant value of the characteristic impedances of the branched second uniform transmission lines is limited and the second individual uniform transmission lines having desired characteristic impedances can be freely provided inside of the semiconductor mask layout of the A/D converter. Therefore, there is also an advantage that the comparators can be arranged without equally distributing the comparators even if the configuration of the area assigned for the comparators is modified.

The terminals of the second uniform transmission lines comprise individually independent resistor elements, the lengths of the branched second uniform transmission lines should not be necessarily the same in mask design. Therefore, there is also advantage that the freedom degree to design is high.

Embodiment 5

Figure 21:
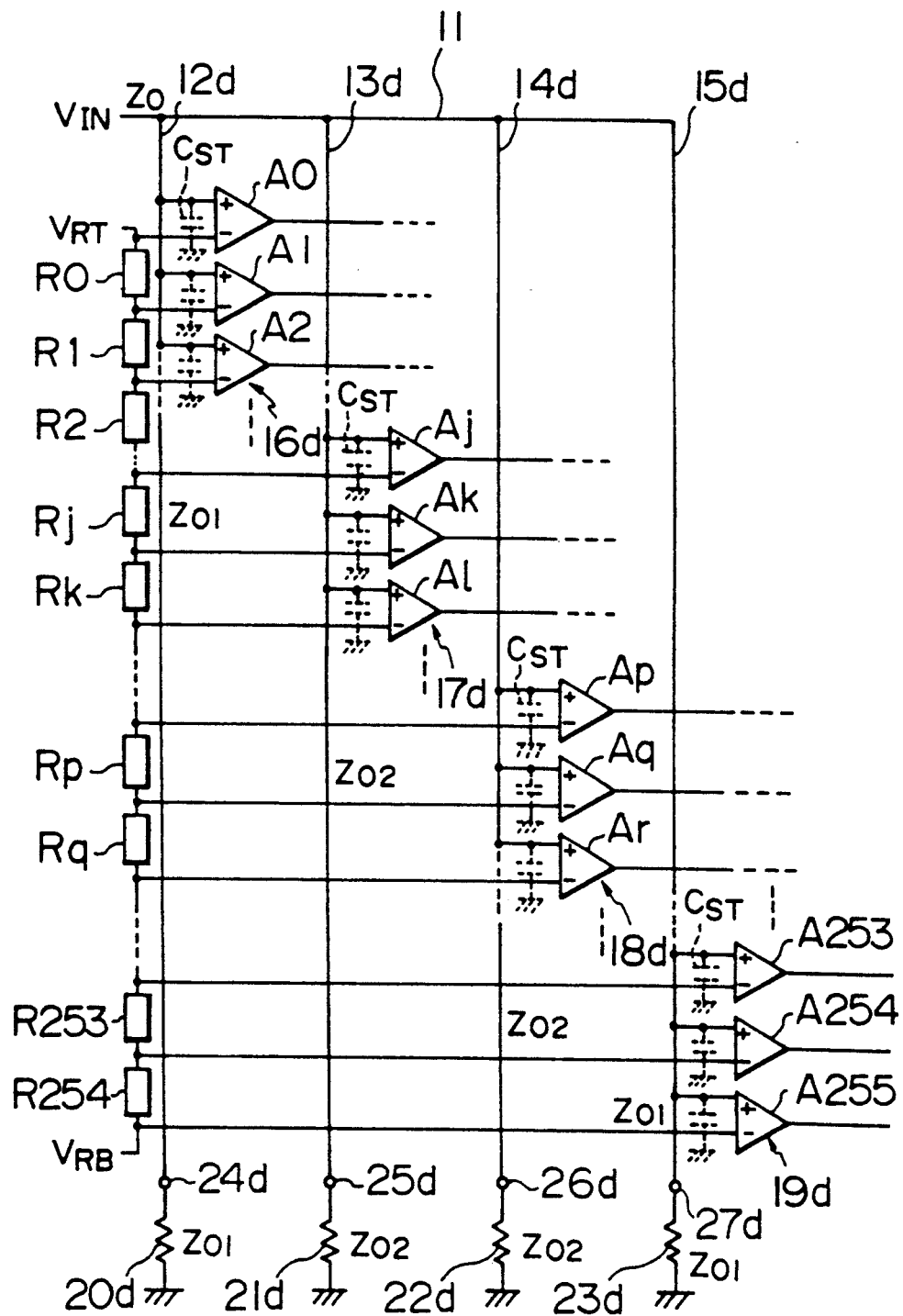
FIG. 21 is a circuit diagram showing an input portion of an embodiment of an A/D converter which is provided in the fifth aspect of the present invention.

Referring now to FIG. 21, there is shown the structure of an input circuit of an embodiment of an 8 bit A/D converter which is provided in the fifth aspect of the present invention.

In FIG. 21, a reference numeral 11 denotes a first uniform transmission line having a constant line width, which is connected with an input terminal for an analog signal to be analog-to-digital converted and in which a specific characteristic impedance $Z_0$ including that of said input terminal is maintained; reference numerals 12d, 13d, 14d, and 15d denote four second uniform transmission lines each having one end connected with the first uniform transmission line 11 and having two characteristic impedances $Z_{01}$ and $Z_{02}$, the resultant impedance of which is equal to the characteristic impedance $Z_0$ of the first uniform transmission line 11; reference numerals 16d, 17d, 18d and 19d denote four comparator groups, each input terminals thereof being connected with respective one of the four second uniform transmission lines 12d, 13d, 14d and 15d. Reference numeral 20d, 21d, 22d and 23d denote externally connecting terminals of the A/D converter which are connected with other ends of the second uniform transmission lines 12d, 13d, 14d and 15d. 20d, 21d, 22d and 23d denote external terminating resistor elements each having one end connected with the externally connecting terminals 24d, 25d, 26d and 27d and the other end connected with a given voltage source (not shown) and have resistances equal to the characteristic impedances $Z_{01}$ and $Z_{02}$ of the second uniform transmission lines 12d, 13d, 14d and 15d. In other words, the impedances of the uniform transmission lines 12d, 15d and the external terminating resistor elements 20d, 27d are $Z_{01}$ and the impedances of the distributed constant lines 13d, 14d and the external terminating resistor elements 21d, 22d are $Z_{02}$.

Figure 22:
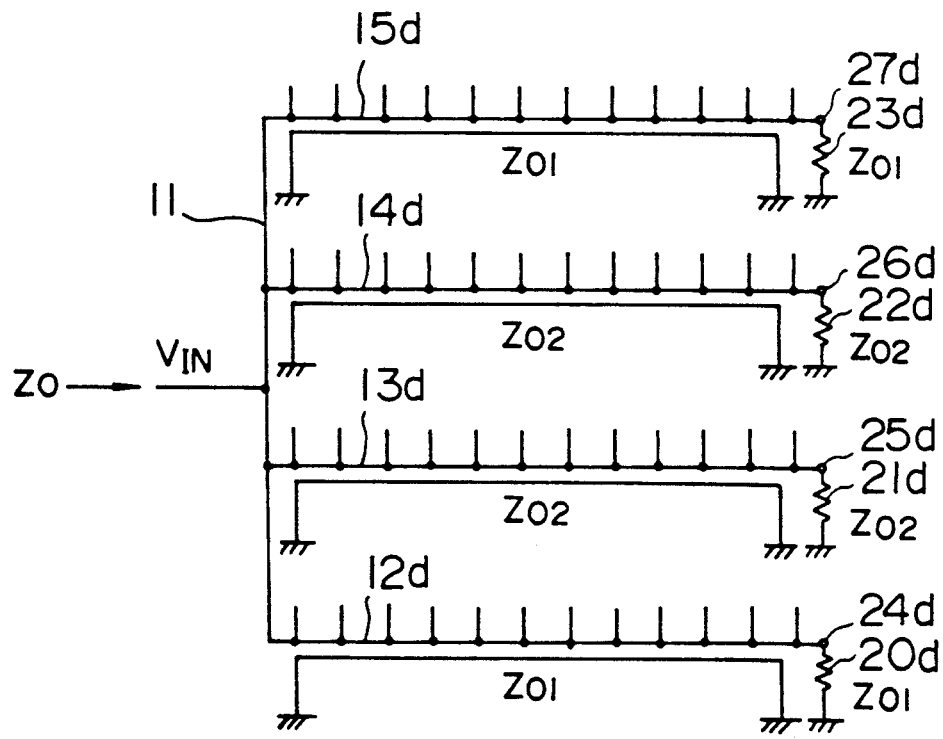
FIG. 22 is a wiring diagram showing a signal input line in the embodiment of FIG. 21.

VIN denotes a signal input line which is connected with an input terminal (not shown) to which an analog signal to be analog-to-digital converted is applied. VRT and VRB denote comparing higher and lower reference voltage input lines, respectively; R0 through R254 denote comparing reference voltage generating resistor groups; A0 through A2, Aj through Al, Ap through Ar and A253 through A255 denote comparators; CST denotes an input electrostatic capacitance of each comparator. FIG. 22 schematically shows simplified groups of the branched lines of the input line and the terminating line in the above mentioned embodiment.

Operation of the fifth embodiment will be described with reference to FIGS. 21 and 22. An analog signal which is inputted to the first uniform transmission line 11 having a characteristic impedance equal to a desired characteristic impedance $Z_0$ including that of the input terminal of the signal input line VIN will be distributed to the second uniform transmission lines 12d, 13d, 14d and 15d which are connected with the first uniform transmission line 11 and passes therethrough. Since the resultant impedance at the branch point of the four distributed constant lines 12d, 13d, 14d and 15d, the lines 12d and 15d each having a characteristic impedance $Z_{01}$ and the lines 13d and 14d each having an impedance $Z_{02}$ is preset equal to the characteristic impedance $Z_0$, impedance matching at the branch point is achieved so that at least the possibility of reflection of the input signal back to the first uniform transmission line 11 is less.

Since the second uniform transmission lines 12d, 13d, 14d and 15d couple with each other the input capacities of the comparators of each group including a quarter of the entire comparators at equal length and provides a characteristic impedance which each of lines 12d, 13d, 14d and 15d desires while each line includes the input capacitances of the comparators as if it were a part of the capacitance of the uniform transmission line, the stray capacitance which is possessed by the signal input line VIN can be distributed to each line and can be made constant, and loading of the capacitance imposed upon the external circuit which supplies a high frequency signal to the signal input line VIN can be reduced.

If such a circuit is formed of a silicon semiconductor, the width of the lines can be made approximate to the thickness of an interlayer insulating layer when the characteristic impedance is 50 ohms since the dielectric constant is approximate to 10. In the embodiment shown in FIG. 21, the following relation is established between the characteristic impedance $Z_0$ possessed by the first uniform transmission line 11 in the signal input line VIN and two characteristic impedances $Z_{01}$ and $Z_{02}$ possessed by the second uniform transmission lines 12d, 13d, 14d and 15d disposed rearward of the branch point.

$$1/Z_0 = 2/Z_{01} + 2/Z_{02}$$

Generally, the characteristic impedances of the second uniform transmission lines 12d, 13d, 14d and 15d can be freely preset while maintaining the relation defined by the formula as follows:

$$1/Z_0 = \Sigma n(mj/Z_{0j})$$

wherein n denotes the kind of the characteristic impedance and m denotes the number of second uniform transmission lines having the same characteristic impedance.

Figure 23:
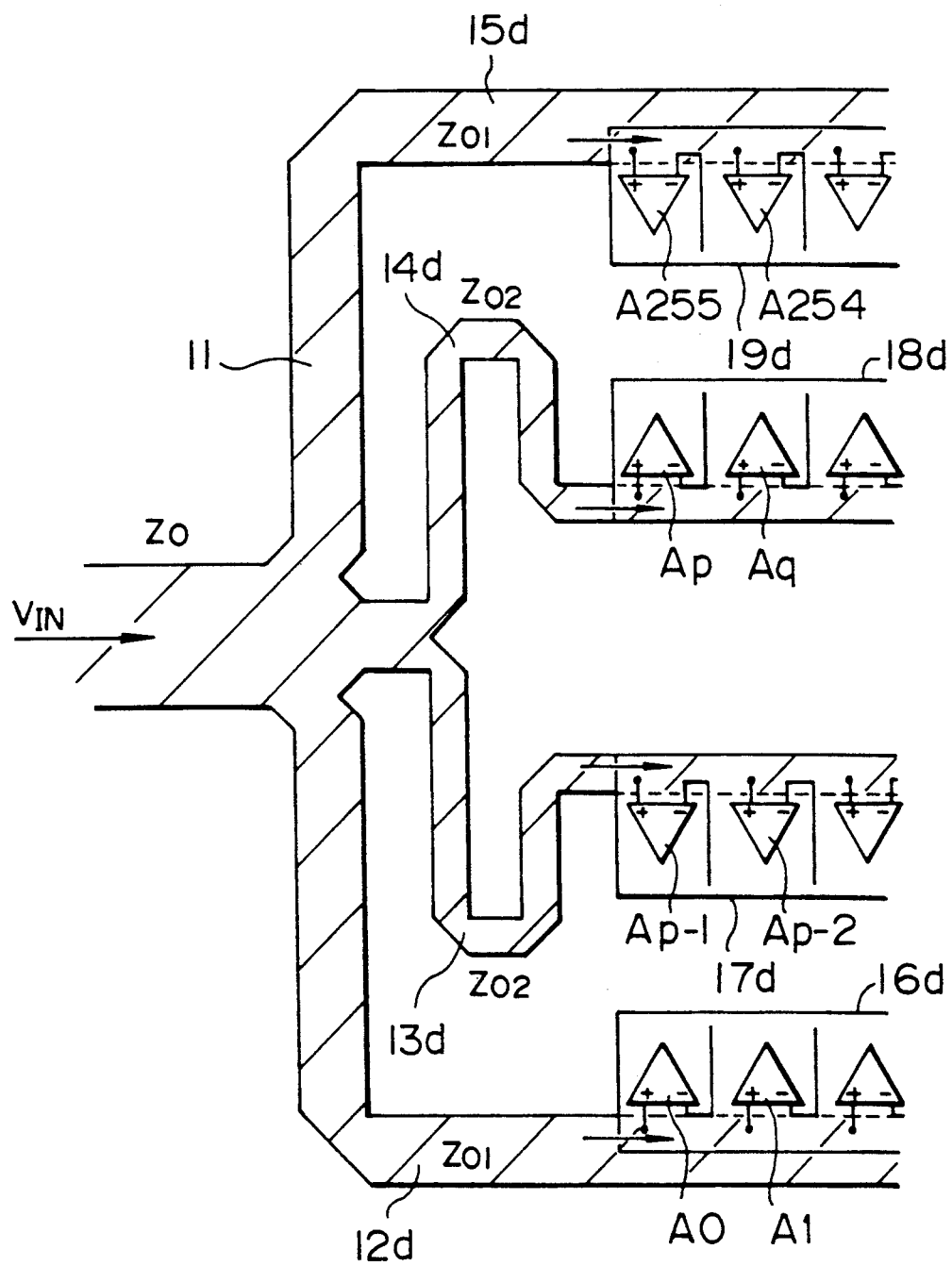
FIG. 23 is a view showing an arrangement of an input side of a semiconductor mask layout in the embodiment.
Figure 24:
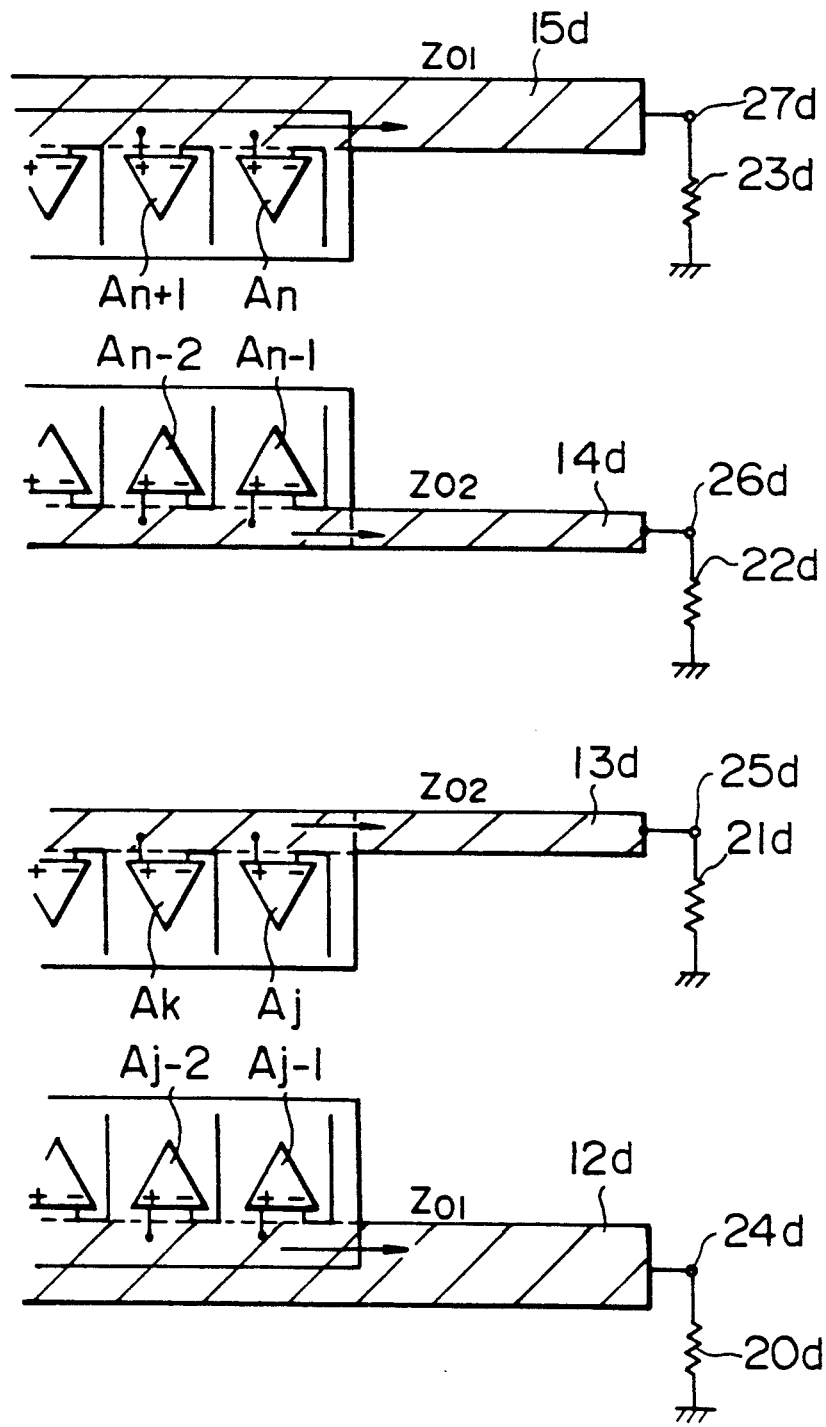
FIG. 24 is a view showing an arrangement of an output side of the semiconductor mask layout in the embodiment.

FIGS. 23 and 24 show a semiconductor mask layout of the A/D converter in the above mentioned embodiment.

By presetting the delay times caused by respective second uniform transmission lines 12d, 13d, 14d and 15d equal to each other, the return periods of time of the reflecting waves are matched with each other. After the input analog signal inputted to the first uniform transmission line 11 having an energy corresponding to the impedance $Z_{01}$ or $Z_{02}$ which is divided by the second uniform transmission lines 12d, 13d, 14d and 15d has passed through the second uniform transmission lines 12d, 13d, 14d and 15d, it is introduced to the external terminating resistor elements 20d, 21d, 22d, 23d through the externally connecting terminals 24d, 25d, 26d and 27d and is dissipated as heat by the resistor elements 20d, 21d, 22d, 23d. Therefore the reflected wave is suppressed.

As mentioned above, in the fifth embodiment of the A/D converter which is provided in the fifth aspect of the present invention, the input electrostatic capacitance in the analog signal input of the A/D converter which tends to become very high can be dispersed over a wide frequency range and can be changed into a given impedance. Accordingly, the loading of the capacitance imposed upon an external circuit which supplies a high frequency signal to the analog signal input line can be reduced and the current loading can be reduced even at higher frequencies. Therefore, there are advantages that an external circuit can be readily driven at up to higher frequency and the high speed conversion operation can be achieved by the A/D converter. Only the resultant value of the characteristic impedances of the branched second uniform transmission lines is limited and the second individual uniform transmission lines having desired characteristic impedances can be freely provided inside of the semiconductor mask layout of the A/D converter. Therefore, there is also an advantage that the comparators can be arranged without equally distributing the comparators even if the configuration of the area assigned for the comparators is modified.

The terminals of the second uniform transmission lines comprise individually independent resistor elements, the lengths of the branched second uniform transmission lines house not be necessarily the same in mask design. Therefore, there is also advantage that the freedom degree to design is high. Furthermore, since a terminating resistor element can be connected externally of the A/D converter via an externally connecting terminal, impedance matching can be accurately adjusted. Power consumption and heat dissipation in the external terminating resistor element can be designed independently of the design of the A/D converter. Therefore, there is also an advantage that the reliability of the A/D converter can be enhanced.

Embodiment 6

Figure 25:
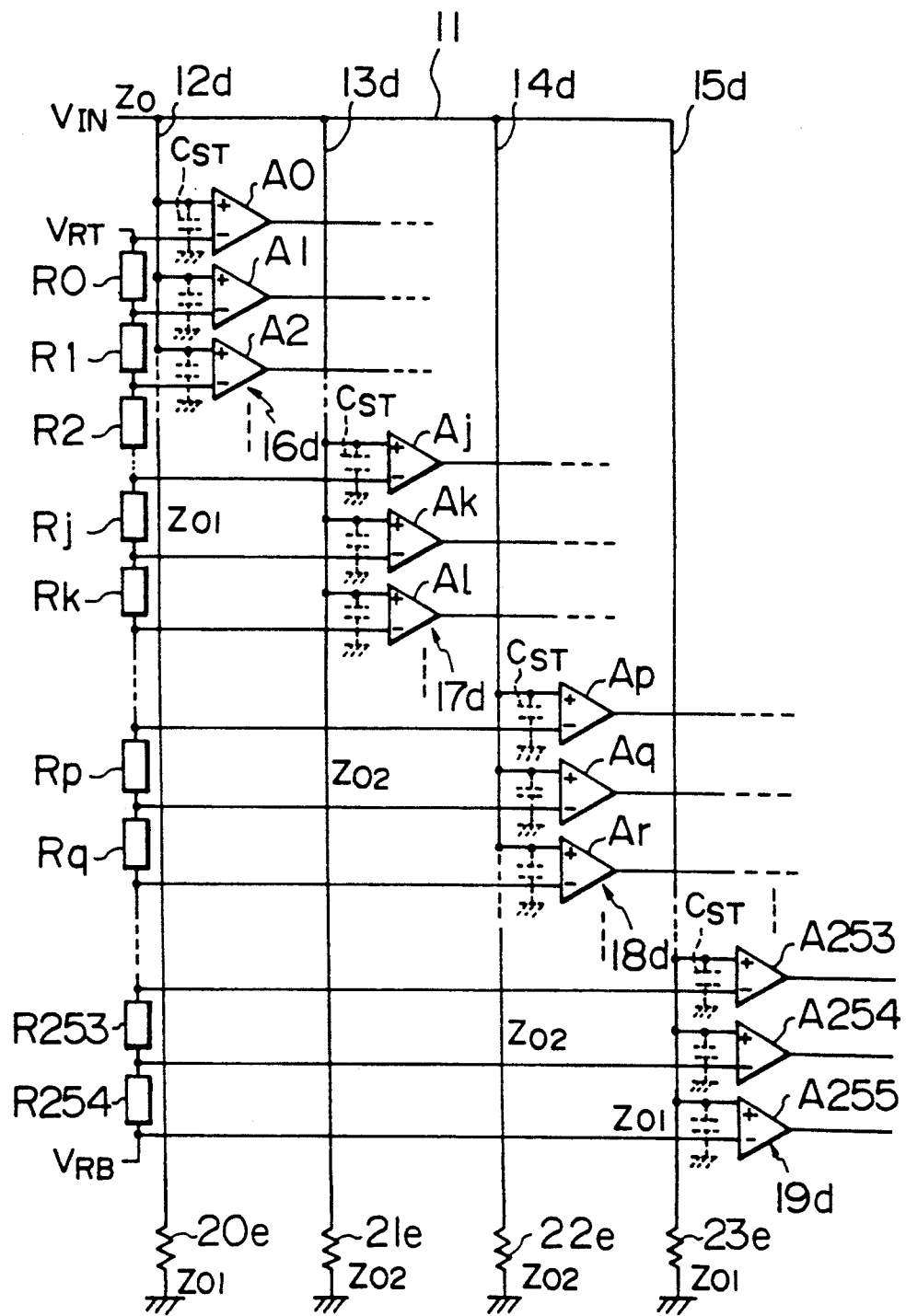
FIG. 25 is a circuit diagram showing an input portion of an embodiment of an A/D converter which is provided in the sixth aspect of the present invention.

Referring now to FIG. 25, there is shown the structure of an input circuit of an embodiment of an 8 bit A/D converter which is provided in the seventh aspect of the present invention.

Since reference numerals 11, 12d to 19d in FIG. 25 denote like components of the sixth embodiment shown in FIG. 21, description thereof will be omitted herein.

Reference numerals 20e, 21e, 22e and 23e denote external terminating resistor elements each having one end connected with the other ends of the four second uniform transmission liens 12d, 13d, 14d and 15d and the other end connected with a given voltage source (not shown) and have resistances equal to the characteristic impedances $Z_{01}$ and $Z_{02}$ of the second uniform transmission lines 12d, 13d, 14d and 15d. In other words, the impedances of the uniform transmission liens 12d, 15d and the external terminating resistor, elements 20e, 27e are $Z_{01}$ and the impedances of the uniform transmission lines 13d, 14d and the external terminating resistor elements 21e, 22e are $Z_{02}$.

VIN denotes a signal input line which is connected with an input terminal (not shown) to which an analog signal to be analog-to-digital converted is applied. VRT and VRB denote comparing higher and lower reference voltage input lines, respectively; R0 through R254 denote comparing reference voltage generating resistor groups; A0 through A2, Aj through Al, Ap through Ar and A253 through A255 denotes comparators; CST denotes an input electrostatic capacitance or each comparator.

Figure 26:
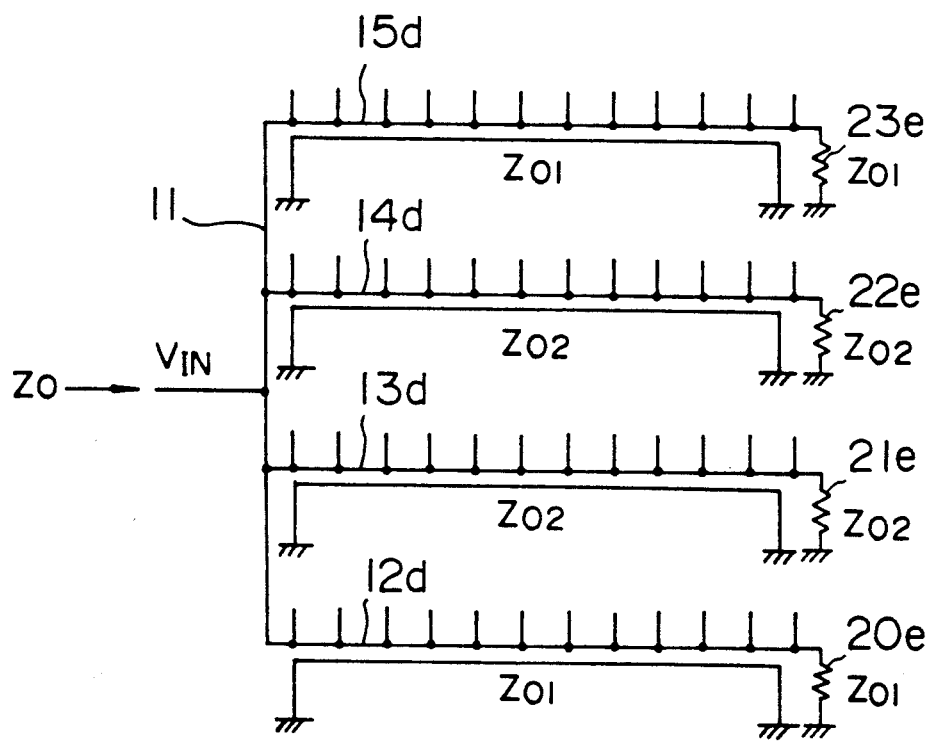
FIG. 26 is a wiring diagram showing a signal input line in the embodiment of FIG. 25.

FIG. 26 schematically shows simplified groups of the branched lines of the input line and the terminating line in the above embodiment.

Operation of the sixth embodiment will be described with reference to FIGS. 25 and 26. An analog signal which is inputted to the first uniform transmission line 11 having a characteristic impedance equal to a desired characteristic impedance $Z_0$ including that of the input terminal of the signal input line VIN will be distributed to the second uniform transmission lines 12d, 13d, 14d and 15d which are connected with the first uniform transmission line 11 and passes therethrough. Since the resultant impedance at the branch point of the four distributed constant lines 12d, 13d, 14d and 15d, the lines 12d and 15d each having a characteristic impedance $Z_{01}$ and the lines 13d and 14d each having a characteristic impedance $Z_{01}$ and the lines 13d and 14d each having an impedance $Z_{02}$ is preset equal to the characteristic impedance $Z_0$, impedance matching at the branch point is achieved so that at least the possibility of reflection of the input signal back to the first uniform transmission line 11 is less. Since the second uniform transmission lines 12d, 13d, 14d and 15d couple with each other the input capacitances of the comparators of each group including a quarter of the entire comparators at equal length and provides a characteristic impedance which each of lines 12d, 13d, 14d and 15d desires while each line includes the input capacitances of the comparators as if it were a part of the capacitance of the uniform transmission line, the stray capacitance which is possessed by the signal input line VIN can be distributed to each line, and can be made constant, and loading of the capacitance imposed upon the external circuit which supplies a high frequency signal to the signal input line VIN can be reduced.

If such a circuit is formed of a silicon semiconductor, the width of the lines can be made approximate to the thickness of an interlayer insulating layer when the characteristic impedance is 50 ohms since the dielectric constant is approximate to 10. In the embodiment shown in FIG. 27, the following relation is established between the characteristic impedance $Z_0$ possessed by the first uniform transmission line 11 in the signal input line VIN and two characteristic impedances $Z_{01}$ and $Z_{02}$ possessed by the second uniform transmission lines $12d$, $13d$, $14d$ and $15d$ disposed rearward of the branch point.

$$1/Z_0 = 2/Z_{01} + 2/Z_{02}$$

Generally the characteristic impedances of the second uniform transmission lines $12d$, $13d$, $14d$ and $15d$ can be freely preset while maintaining the relation defined by the formula as follows:

$$1/Z_0 = \Sigma n \, (mj/Z_{0j})$$

wherein n denotes the kind of the characteristic impedance and m denotes the number of second uniform transmission lines having the same characteristic impedance.

Figure 27:
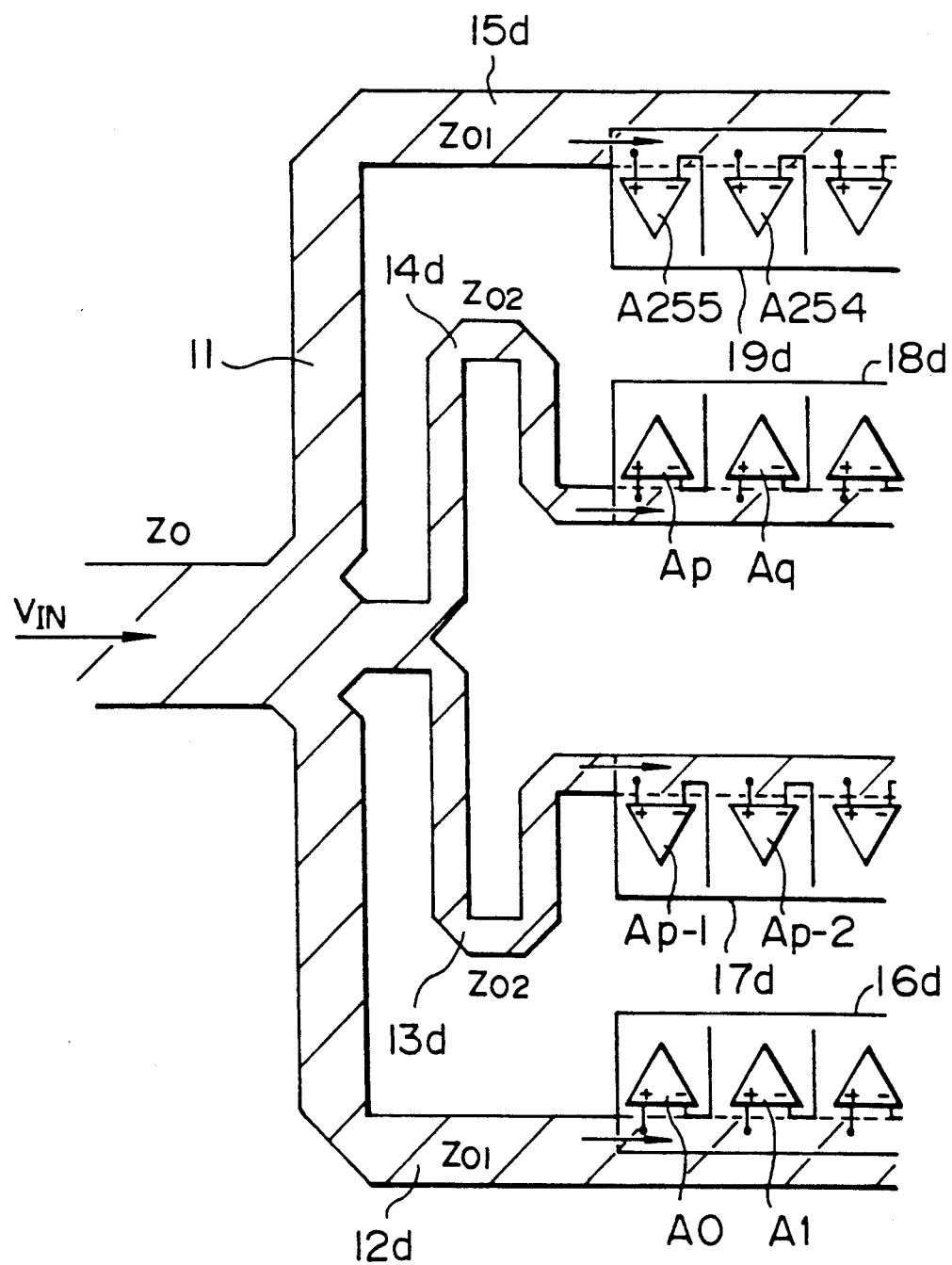
FIG. 27 is a view showing an arrangement of an input side of a semiconductor mask layout in the embodiment.
Figure 28:
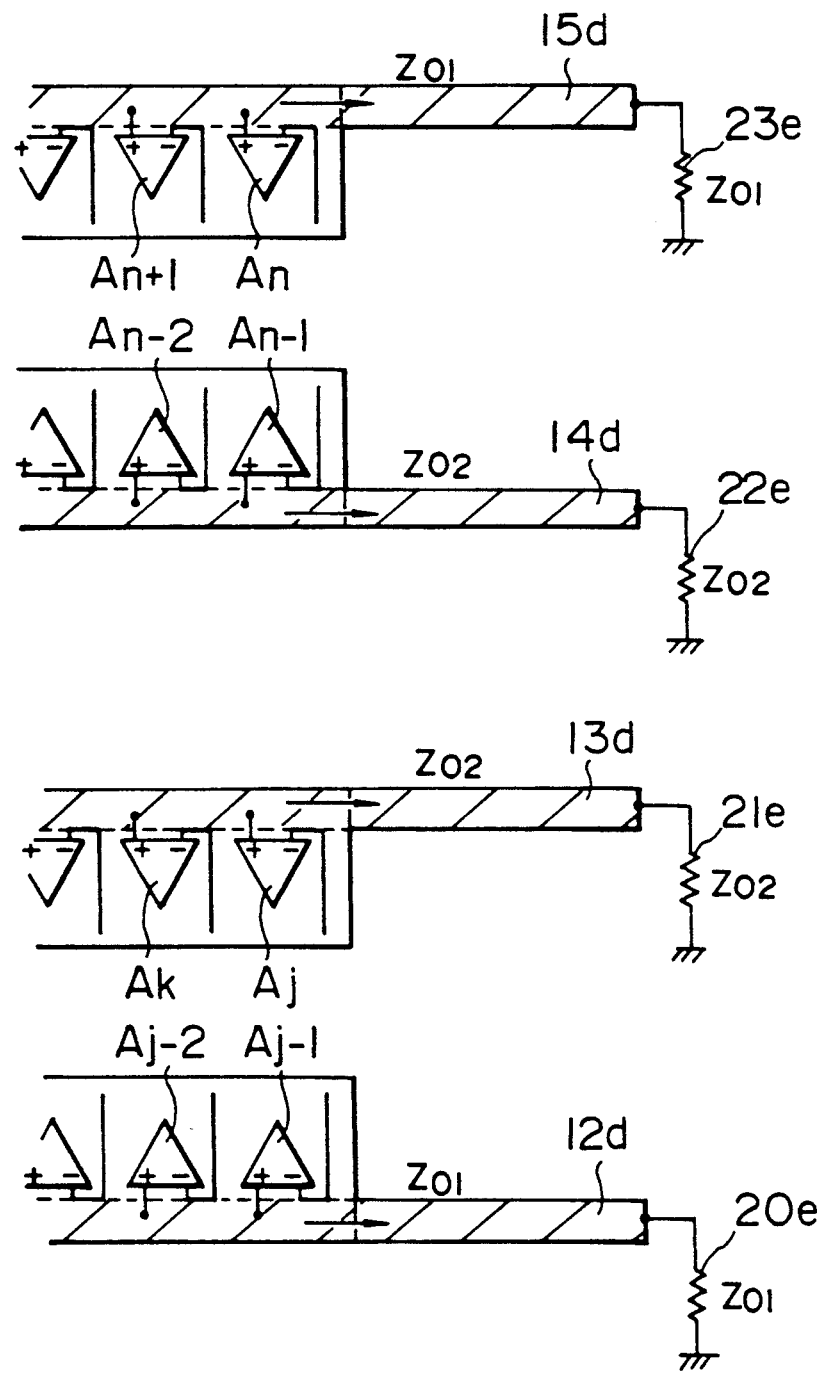
FIG. 28 is a view showing an arrangement of an output side of the semiconductor mask layout in the embodiment.

FIGS. 27 and 28 show a semiconductor mask layout of the A/D converter in the above mentioned embodiment.

By presetting the delay times caused by respective second uniform transmission lines $12d$, $13d$, $14d$ and $15d$ equal to each other, the return periods of time of the reflecting waves are matched with each other. After the input analog signal inputted to the first uniform transmission line 11 having a characteristic impedance equal to the characteristic impedance $Z_0$ has passed through the second uniform transmission lines $12d$ and $15d$ and the third uniform transmission liens $13d$ and $14d$, it is introduced to the external terminating resistor elements $20e$, $21e$, $22e$ and $23e$ having the impedances $Z_{01}$ or $Z_{02}$ and is dissipated as heat by the resistor elements. Therefore, the reflected wave is suppressed.

As mentioned above, in the sixth embodiment of the A/D converter which is provided in the seventh aspect of the present invention, the input electrostatic capacitance in the analog signal input of the A/D converter which tends to become very high can be dispersed over a wide frequency range and can be changed into a given impedance. Accordingly, the loading of the capacitance imposed upon an external circuit which supplies a high frequency signal to the analog signal input line can be reduced and the current loading can be reduced even at higher frequencies. Therefore, there are advantages that an external circuit can be readily driven at up to higher frequency and the high speed conversion operation can be achieved by the A/D converter. Only the resultant value of the characteristic impedances of the branched second uniform transmission lines is limited and the second individual uniform transmission lines having desired characteristic impedances can be freely provided inside of the semiconductor mask layout of the A/D converter. Therefore, there is also an advantage that the comparators can be arranged without equally distributing the comparators even if the configuration of the area assigned for the comparators is modified.

The terminals of the second uniform transmission lines comprise individually independent resistor elements, the lengths of the branched second uniform transmission lines should not be necessarily the same in mask design. Therefore, there is also advantage that the freedom degree to design is high.

Embodiment 7

Figure 29:
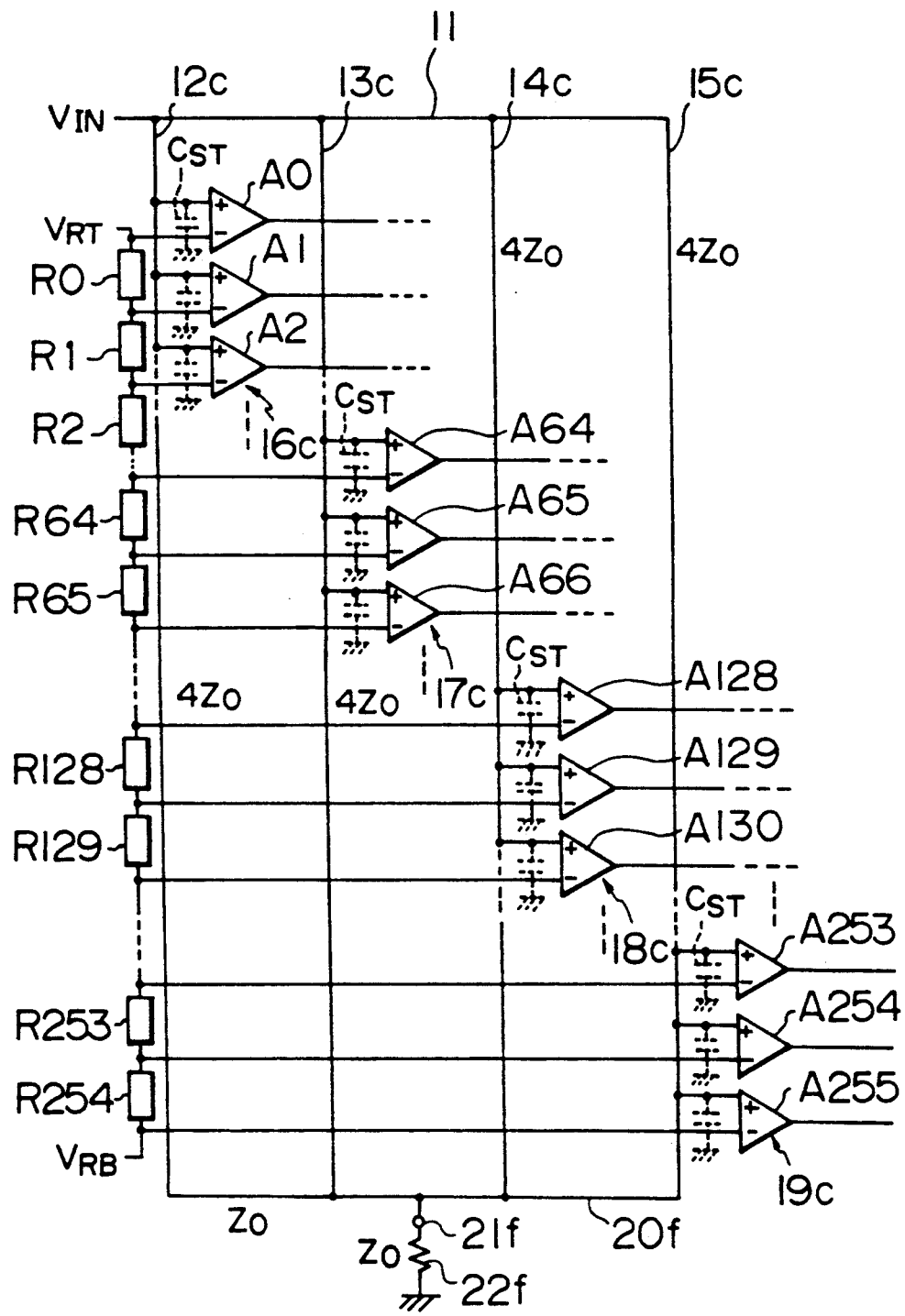
FIG. 29 is a circuit diagram showing an input portion of an embodiment of an A/D converter which is provided in the seventh aspect of the present invention.

Referring now to FIG. 29, there is shown the structure of an input circuit of an embodiment of an 8 bit A/D converter which is provided in the seventh aspect of the present invention.

Since reference numerals 11, $12c$ to $19c$ in FIG. 29 denote like components of the third embodiment of the present invention shown in FIG. 17, description thereof will be omitted herein. A reference numeral $20f$ denotes a third uniform transmission line connected with the other ends of four second uniform transmission liens $12c$, $13c$, $14c$ and $15c$ and having a characteristic impedance, $Z_0$ equal to that of the first uniform transmission line 11. A reference numeral $21f$ denotes an externally connecting terminal of the A/D converter which is connected with the third uniform transmission line $20f$. $22f$ denotes an external terminating resistor element having one end connected with the externally connecting terminal $21f$ and the other end connected with a given voltage source (not shown). The resistor $22f$ has a resistance equal to the characteristic impedance of the first uniform transmission line 11.

Figure 30:
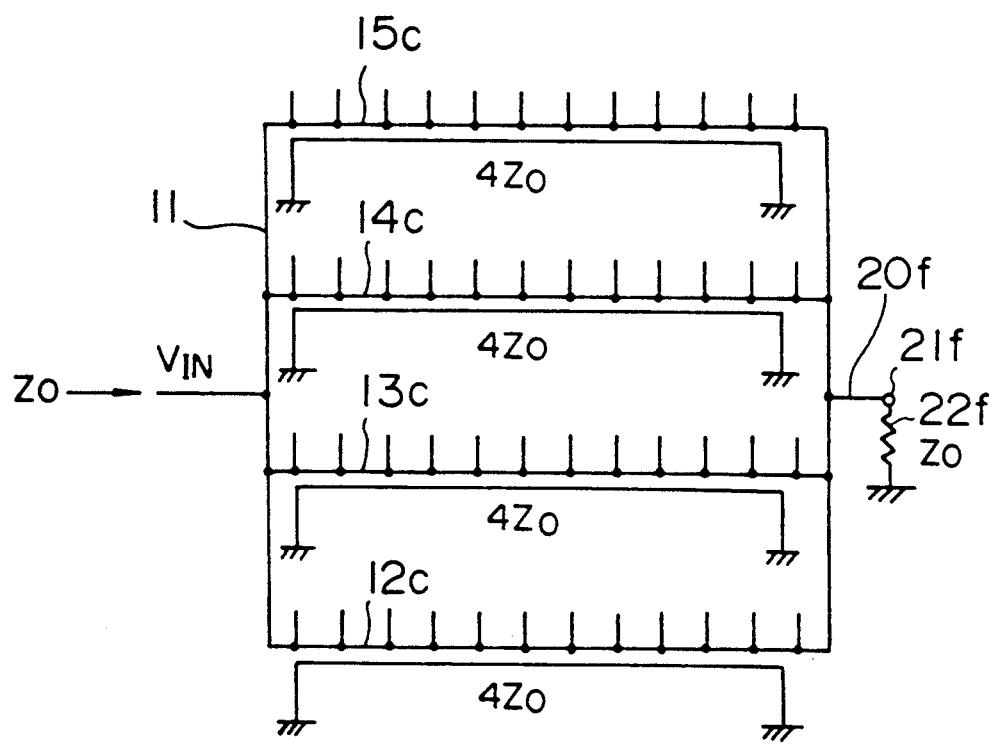
FIG. 30 is a wiring diagram showing a signal input line in the embodiment of FIG. 29.

VIN denotes a signal input line which is connected with an input terminal (not shown) to which an analog signal to be analog-to-digital converted is applied. VRT and VRB denote comparing higher and lower reference voltage input lines, respectively; R0 through R254 denote comparing reference voltage generating resistor groups; A0 through A2, A64 through A66, A128 through A130 and A253 through A255 denote comparators; CST denotes an input electrostatic capacity of each comparator. FIG. 30 schematically shows simplified groups of the branched lines of the input line and the terminating line in the above mentioned, embodiment.

Operation of the seventh embodiment will be described with reference to FIGS. 29 and 30. An analog signal which is inputted to the first uniform transmission line 11 having a characteristic impedance equal to a desired characteristic impedance $Z_0$ including that of the input terminal of the signal input line VIN will be distributed to the second distributed constant lines $12c$, $13c$, $14c$ and $15c$ which are connected with the first uniform transmission line 11 and passes therethrough. Since the resultant impedance at the branch point of the four uniform transmission lines $12c$, $13c$, $14c$ and $15c$, each having a characteristic impedance $4Z_0$ is preset equal to the characteristic impedance $Z_0$, impedance matching at the branch point is achieved so that at least the possibility of reflection of the input signal back to the first uniform transmission line 11 is less.

Since the second uniform transmission lines $12c$, $13c$, $14c$ and $15c$ couple with each other the input capacitances of the comparators of each group including a quarter of the entire comparators at equal length and provides a characteristic impedance $4Z_0$ which is four times as high as the characteristic while each line includes the input capacitances of the comparators as if it were a part of the capacitances of the uniform transmission line, the stray capacitance which is possessed by the signal input line VIN can be distributed to each line and can be made constant, and loading of the capacitance imposed upon the external circuit which supplies a high frequency signal to the signal input line VIN can be reduced.

If such a circuit is formed of a silicon semiconductor, the width of the lines can be made approximate to the thickness of an interlayer insulating layer when the characteristic impedance is 50 ohms since the dielectric constant is approximate to 10.

Figure 31:
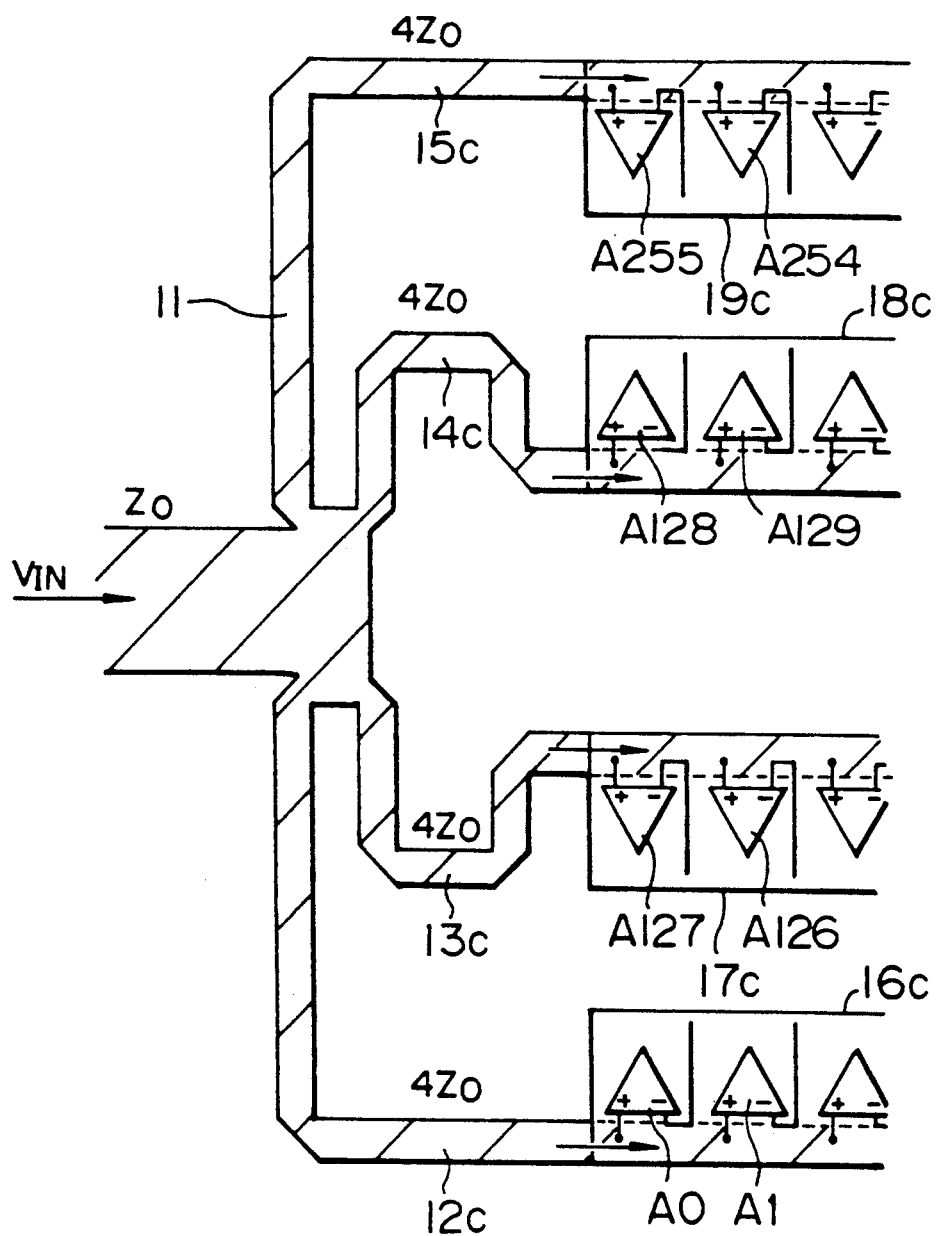
FIG. 31 is a view showing an arrangement of an input side of a semiconductor mask layout in the embodiment.
Figure 32:
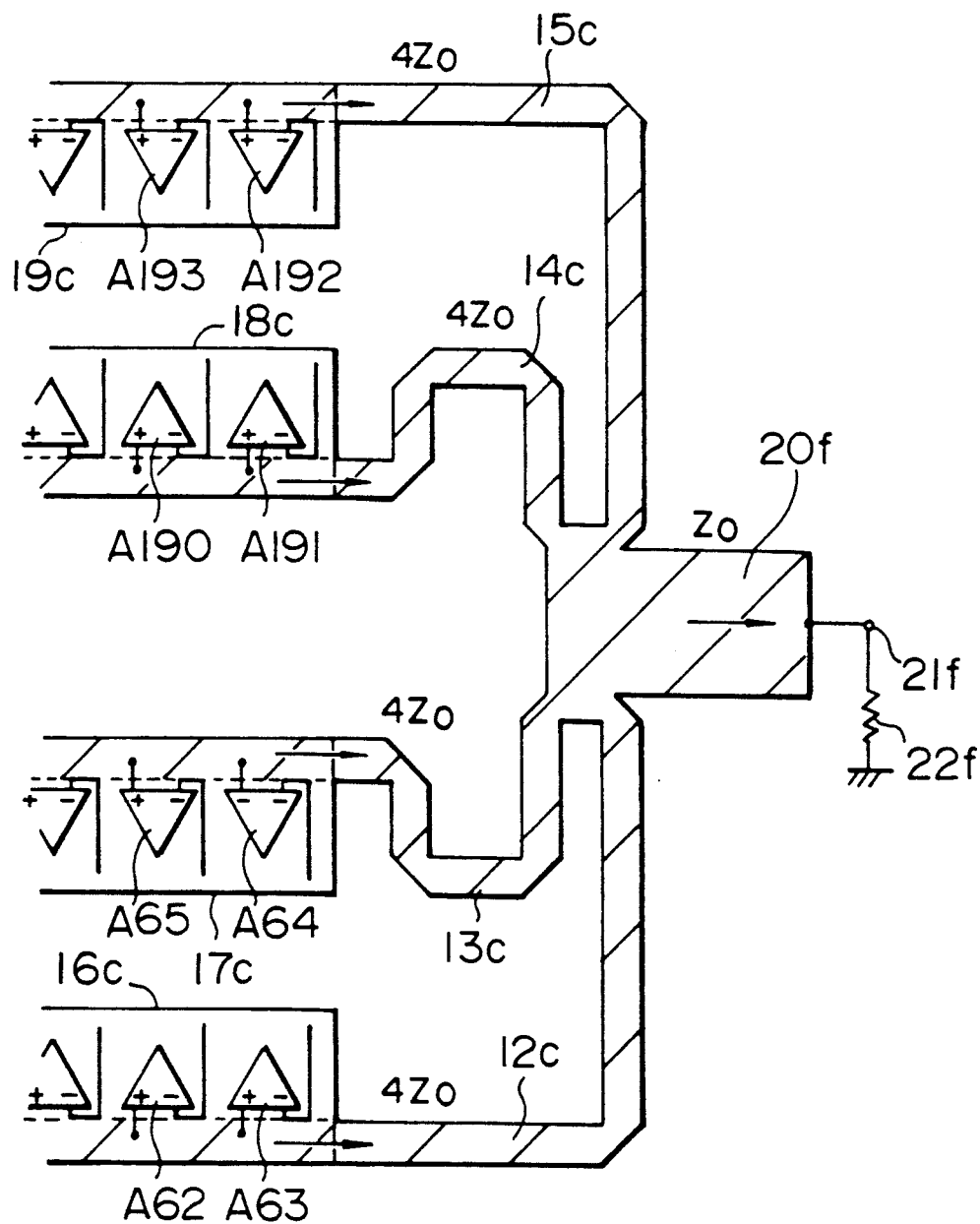
FIG. 32 is a view showing an arrangement of an output side of the semiconductor mask layout in the embodiment.

FIGS. 31 and 32 show a semiconductor mask layout of the A/D converter in the above mentioned embodiment. The circuit is very excellent in symmetry.

By presetting the delay times caused by respective second uniform transmission lines $12c$, $13c$, $14c$ and $15c$ equal to each other, the return periods of time of the reflecting waves are matched with each other. After the input analog signal inputted to the first uniform transmission line 11 having an energy corresponding to the impedance $4Z_0$, which is divided by the second uniform transmission lines $12c$, $13c$, $14c$ and $15c$ has passed through the second distributed constant lines $12c$, $13c$, $14c$ and $15c$, it is introduced to the external terminating resistor elements $20f$, $21f$, $22f$ and $23f$ and is dissipated as heat by the resistor elements, respectively. Therefore, the reflected wave is suppressed.

As mentioned above, in the seventh embodiment of the A/D converter which is provided in the seventh aspect of the present invention, the input electrostatic capacitance in the analog signal input of the A/D converter which tends to become very high can be dispersed over a wide frequency range and can be changed into a given impedance. Accordingly, the loading of the capacitance imposed upon an external circuit which supplies a high frequency signal to the analog signal input line can be reduced and the current loading can be reduced even at higher frequencies. Therefore, there are advantages that an external circuit can be readily driven at up to higher frequency and the high speed conversion operation can be achieved by the A/D converter. Only the resultant value of the characteristic impedances of the branched second uniform transmission lines is limited and the second individual uniform transmission lines having desired characteristic impedances can be freely provided inside of the semiconductor mask layout of the A/D converter. Therefore, there is also an advantage that the comparators can be arranged without equally distributing the comparators even if the configuration of the area assigned for the comparators is modified.

The terminals for the second uniform transmission lines comprise individually independent resistor elements, the lengths of the branched second uniform transmission lines should not be necessarily the same in mask design. Therefore, there is also advantage that the freedom degree to design is high. Furthermore, since a terminating resistor element can be connected externally of the A/D converter via an externally connecting terminal, impedance matching can be accurately adjusted. Power consumption and heat dissipation in the external terminating resistor element can be designed independently of the design of the A/D converter. Therefore, there is also an advantage that the reliability of the A/D converter can be enhanced.

Embodiment 8

Figure 33:
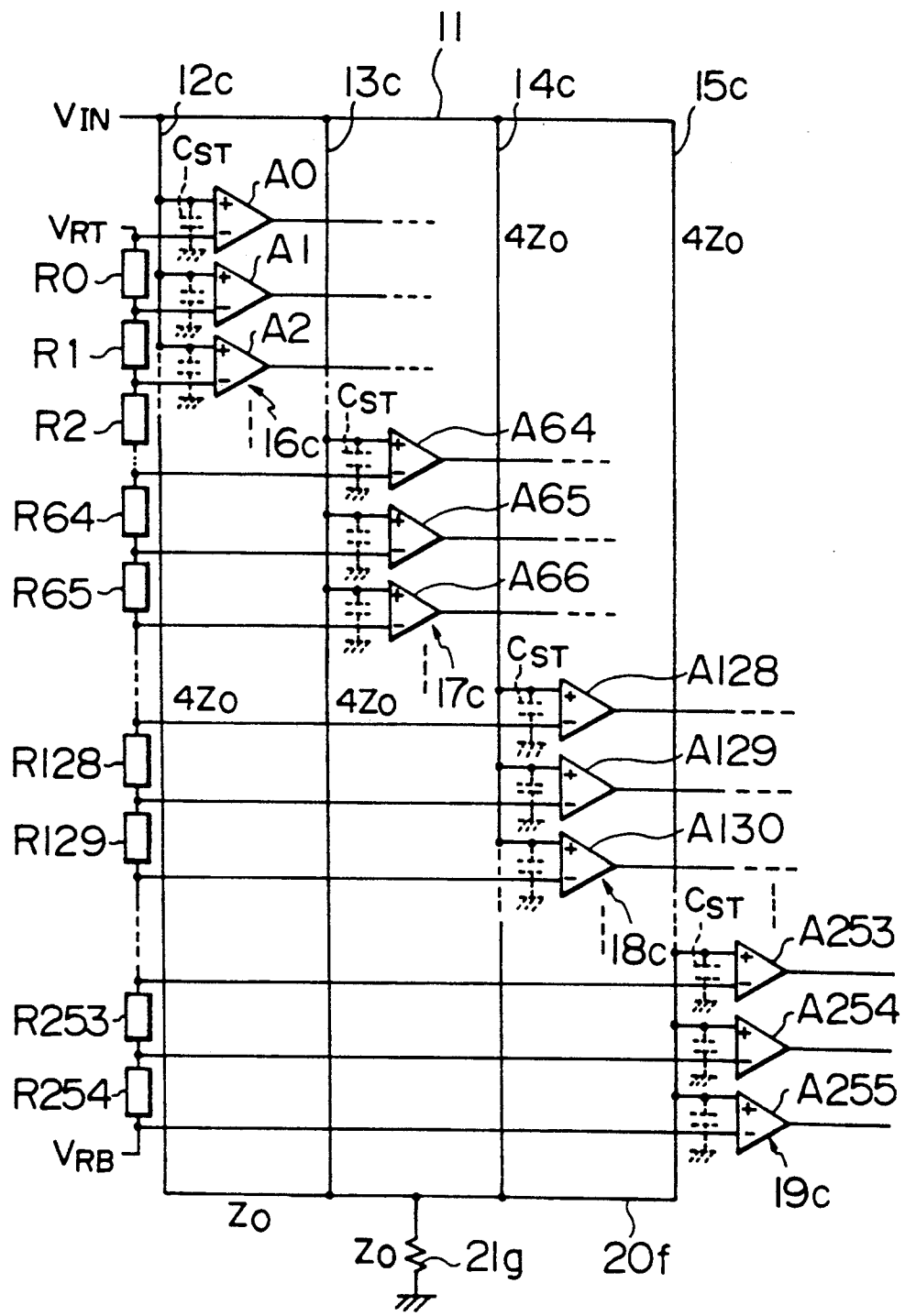
FIG. 33 is a circuit diagram showing an input portion of an embodiment of an A/D converter which is provided in the eighth aspect of the present invention.

Referring now to FIG. 33, there is shown the structure of an input circuit of an embodiment of an 8 bit A/D converter which is provided in the eighth aspect of the present invention.

Since reference numerals 11, $12c$ to $19c$, $20f$ in FIG. 33 denote like components of the seventh embodiment of the present invention shown in FIG. 29, description thereof will be omitted herein.

A reference $21g$ denotes an external terminating resistor element having one end connected with the third uniform transmission line $20f$ and the other end connected with a given voltage source (not shown) and has a resistance equal to the characteristic impedance $Z_0$ of the third uniform transmission line $20f$.

VIN denotes a signal input line which is connected with an input terminal (not shown) to which an analog signal to be analog-to-digital converted is applied. VRT and VRB denote comparing higher and lower reference voltage input lines, respectively; R0 through R254 denote comparing reference voltage generating resistor groups; A0 through A2, A64 through A66, A128 through A130 and A253 through A255 denote comparators; CST denotes an input electrostatic capacitance of each comparator.

Figure 34:
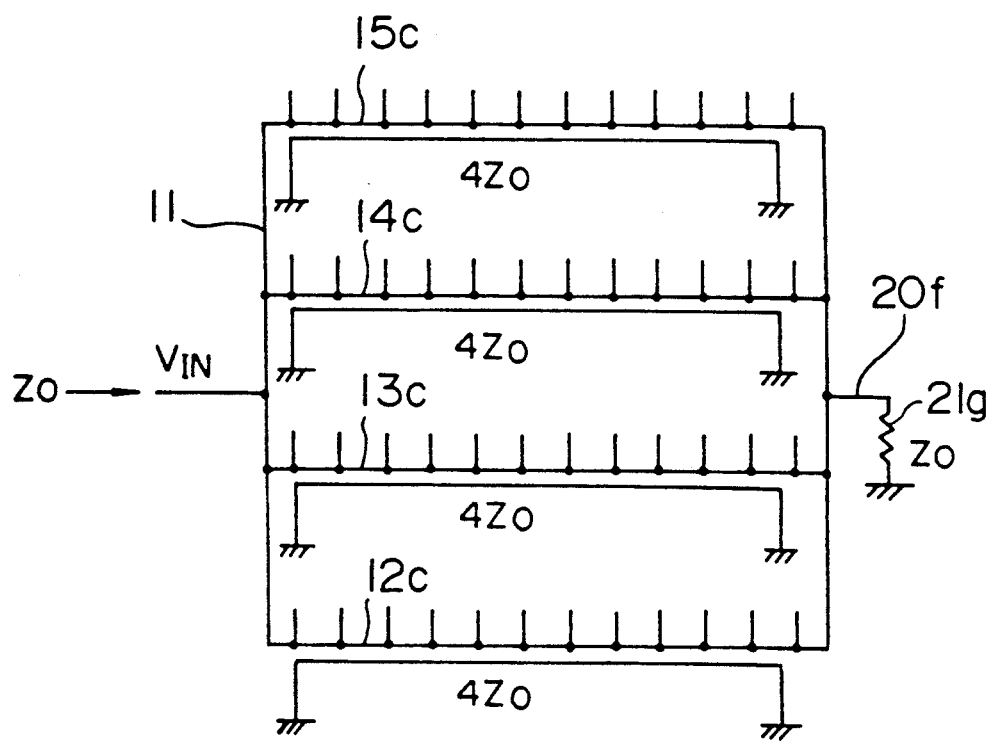
FIG. 34 a wiring diagram showing a signal input line in the embodiment of FIG. 33.

FIG. 34 schematically shows simplified groups of the branched lines of the input line and the terminating line in the above mentioned, embodiment.

Operation of the eighth embodiment will be described with reference to FIGS. 33 and 34. An analog signal which is inputted to the first uniform transmission line 11 having a characteristic impedance equal to a desired characteristic impedance $Z_0$ including that of the input terminal of the signal input line VIN will be distributed to the second uniform transmission lines $12c$, $13c$, $14c$ and $15c$ which are connected with the first uniform transmission line 11 and passes therethrough. Since the resultant impedance at the branch point of the four uniform transmission lines $12c$, $13c$, $14c$ and $15c$, each having a characteristic impedance $4Z_0$ is preset equal to the characteristic impedance $Z_0$, impedance matching at the branch point is achieved so that at least the possibility of reflection of the input signal back to the first uniform transmission line 11 is less. Since the second uniform transmission lines $12c$, $13c$, $14c$ and $15c$ couple with each other the input capacitances of the comparators of each group including a quarter of the entire comparators at equal length and provides a characteristic impedance $4Z_0$, which is four times as high as the characteristic impedance $Z_0$ while each line includes the input capacitance of the comparators as if it were, a part of the capacitance of the uniform transmission line, the stray capacitance which is possessed by the signal input line VIN can be distributed to each line and can be made constant, and loading of the capacitance imposed upon the external circuit which supplies a high frequency signal to the signal input line VIN can be reduced.

If such a circuit is formed of a silicon semiconductor, the width of the lines can be made approximate to the thickness of an interlayer insulating layer when the characteristic impedance is 50 ohms since the dielectric constant is approximate to 10.

Figure 35:
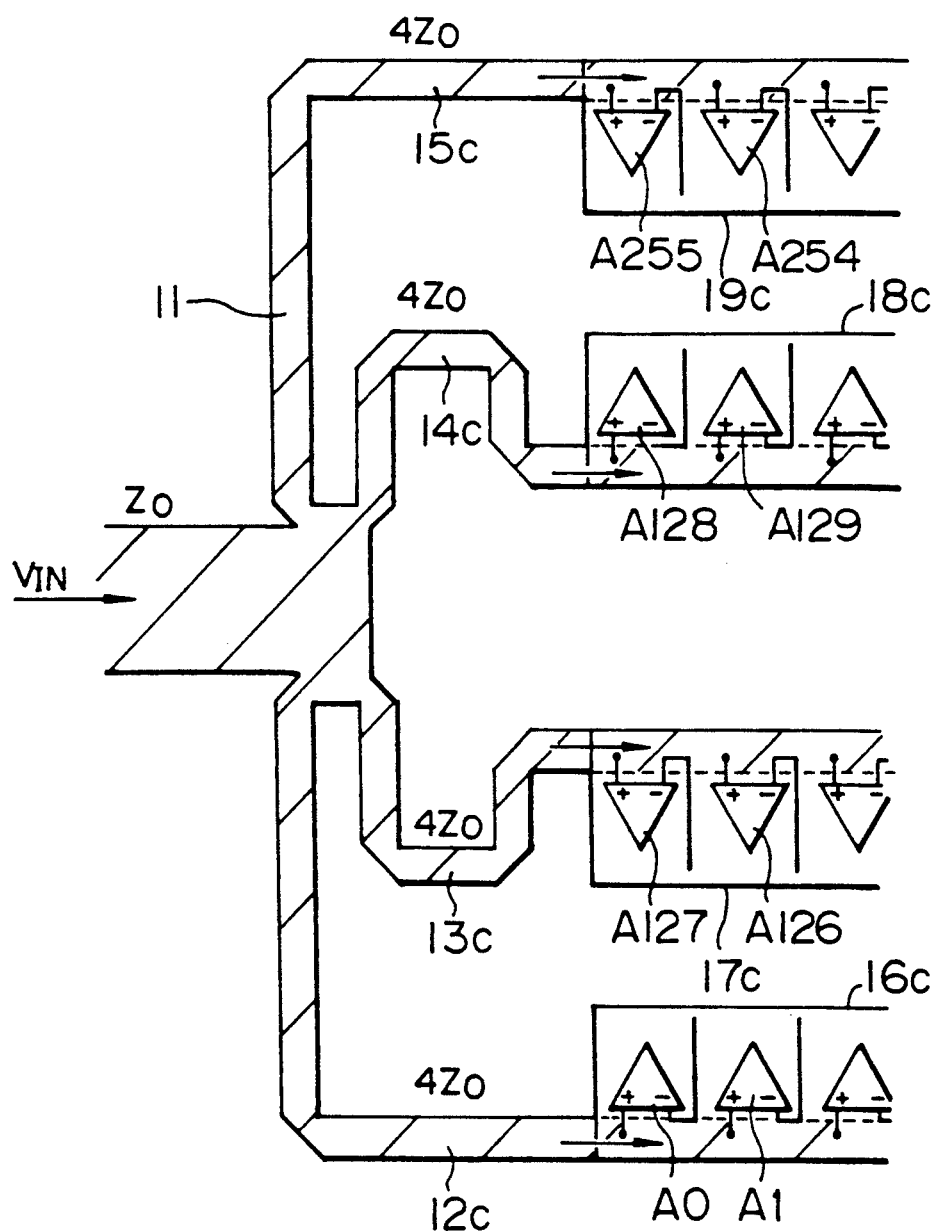
FIG. 35 is a view showing an arrangement of an input side of a semiconductor mask layout in the embodiment.
Figure 36:
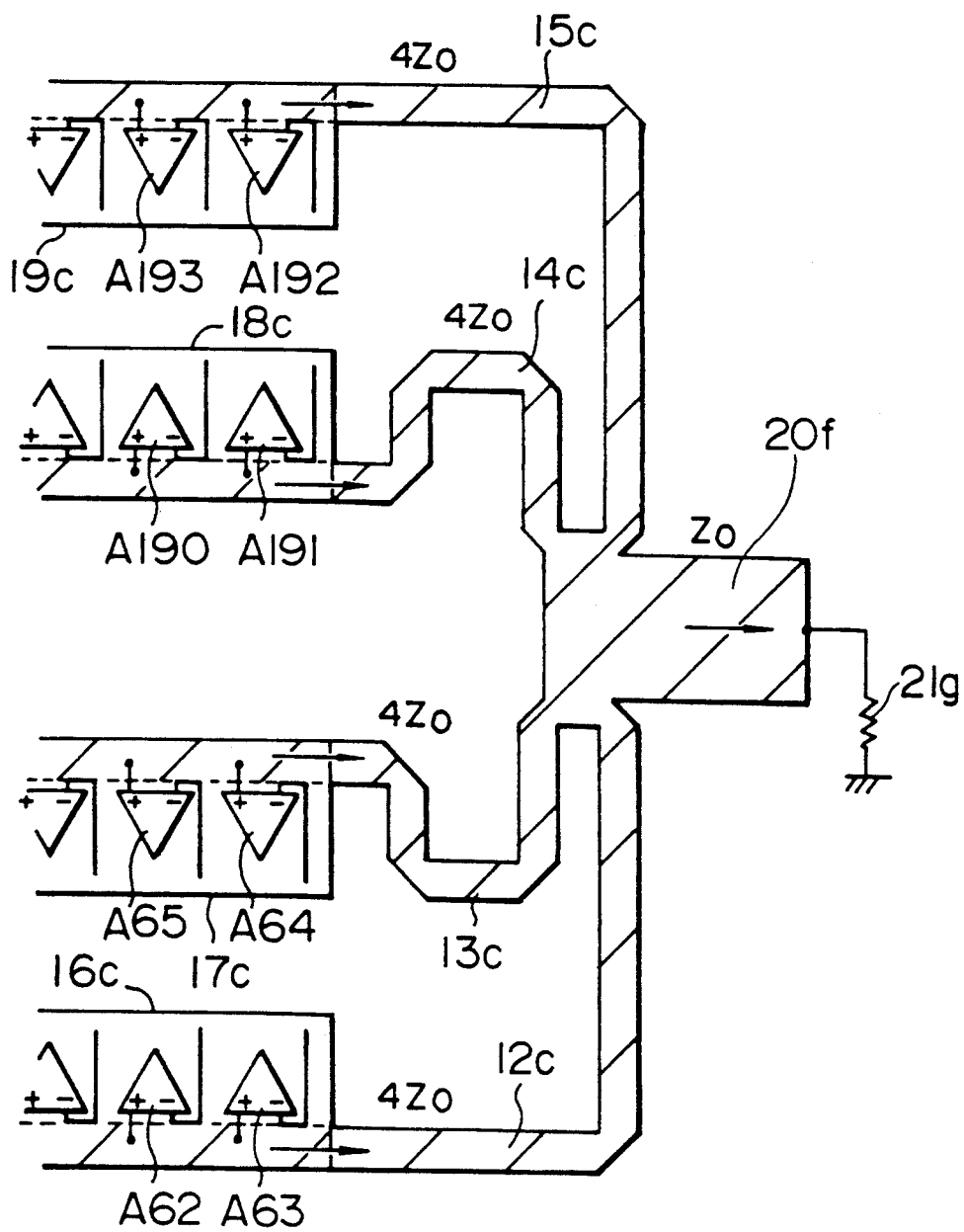
FIG. 36 is a view showing an arrangement of an output side of the semiconductor mask layout in the embodiment.

FIGS. 35 and 36 show a semiconductor mask layout of the A/D converter in the above mentioned embodiment. The circuit is very excellent in symmetry.

By presetting the delay times caused by respective second uniform transmission lines 12c, 13c, 14c and 15c equal to each other, the return periods of time of the reflecting waves are matched with each other. After the input analog signal inputted to the first distributed constant line 11 having a characteristic impedance equal to the characteristic impedance $Z_0$ has passed through the second uniform transmission lines 12c, 13c, 14c and 15c and the third uniform transmission line 20f, it is introduced to the external terminating resistor element 21g and is dissipated as heat by the resistor element 21g. Therefore, the reflected wave is suppressed.

As mentioned above, in the first embodiment of the A/D converter which is provided in the first aspect of the present invention, the input electrostatic capacitance in the analog signal input of the A/D converter which tends to become very high can be dispersed over a wide frequency range and can be changed into a given impedance. Accordingly, the loading of the capacitance imposed upon an external circuit which supplies a high frequency signal to the analog signal input line can be reduced and the current loading can be reduced even at higher frequencies. Therefore, there are advantages that an external circuit can be readily driven at up to higher frequency and the high speed conversion operation can be achieved by the A/D converter. Only the resultant value of the characteristic impedances of the branched second uniform transmission lines is limited and the second individual uniform transmission lines having desired characteristic impedances can be freely provided inside of the semiconductor mask layout of the A/D converter. Therefore, there is also an advantage that the comparators can be arranged without equally distributing the comparators even if the configuration of the area assigned for the comparators is modified.

I claim:

1. An analog-to-digital converter comprising:
   a first uniform transmission line connected with an input terminal for receiving an analog signal to be analog-to-digital converted in which a specific characteristic impedance including that of said input terminal is maintained;
   M second uniform transmission lines each having one end connected with said first uniform transmission line and having N characteristic impedances, the resultant impedance of which is equal to the characteristic impedance of said first uniform transmission line;
   M groups comparators, each of the comparators having a comparing input terminal connected with a respective one of said M second lines and defining part of the distributed capacitance of the one of the M second uniform transmission lines to which it is connected;
   a third line connected with the other ends of said M second uniform transmission lines and having a characteristic impedance equal to that of said first uniform transmission line; and
   a terminating resistor element having one end connected with said third uniform transmission line and another end connected with a given voltage source and having a resistance equal to the characteristic impedance of said third uniform transmission line.

2. An analog-to-digital converter comprising:
   a first uniform transmission line connected with an input terminal for receiving an analog signal to be analog-to-digital converted in which a specific characteristic impedance including that of said input terminal is maintained;
   M second uniform transmission lines each having one end connected with said first uniform transmission line and having N characteristic impedances, the resultant impedance of which is equal to the characteristic impedance of said first uniform transmission line;
   M groups of cómparators, each of the comparators having a comparing input terminal connected with a respective one of said M second uniform transmission lines and defining part of the distributed capacitance of the one of the M second uniform transmission lines to which it is connected;
   a third uniform transmission line connected with the other ends of said M second uniform transmission lines and having a characteristic impedance equal to that of said first uniform transmission line; and
   a terminating resistor element having one end connected with said third uniform transmission line an another rend connected with a given voltage source and having a resistance equal tot he characteristic impedance of said third uniform transmission line.

3. An analog-to-digital converter comprising:
   a first uniform transmission line connected with an input terminal for receiving an analog signal to be analog-to-digital converted in which a specific characteristic impedance including that of said input terminal is maintained;
   N second uniform transmission lines each having a first end connected with said first uniform transmission line and each having a characteristic impedance which is N times as high as the characteristic impedance of said first uniform transmission line;
   a plurality of groups of comparators, each of the comparators having a comparing input terminal connected with a respective one of said N second uniform transmission lines and defining part of the distributed capacitance of the one of the n second uniform transmission lines to which it is connected; and
   a plurality of terminating resistor elements having first ends connected with second ends of said N second uniform transmission lines and second ends connected with a given voltage source external and having a resistance equal to each of the characteristic impedances of said second uniform transmission lines.

4. An analog-to-digital converter comprising:
   a first uniform transmission line connected with an input terminal for receiving an analog signal to be analog-to-digital converted in which a specific characteristic impedance including that of said input terminal is maintained;
   N second uniform transmission lines each having a first end connected with said first uniform transmission line and each having a characteristic impedance which is N times as high as the characteristic impedance of said first uniform transmission line;
   a plurality of groups of comparators, each of the comparators having a comparing input terminal connected with a respective one of said N second uniform transmission lines and defining part of the distributed capacitance of the one of the N second uniform transmission lines to which it is connected;
   a plurality of terminating resistor elements having first ends connected with second ends of said N second uniform transmission lines and second ends connected with a given voltage source and having a resistance equal to the characteristic impedance of each of said second uniform transmission lines.

5. An analog-to-digital converter comprising:
a first uniform transmission line connected with an input terminal for receiving an analog signal to be analog-to-digital converted in which a specific characteristic impedance including that of said input terminal is maintained;
M second uniform transmission lines each having one end connected with said first uniform transmission line and having N characteristic impedances, the resultant impedance of which is equal to the characteristic impedance of said first uniform transmission line;
M groups of comparators, each of the comparators having a comparing input terminal connected with a respective one of said M second uniform transmission lines and defining par of the distributed capacitance of the one of the M second uniform transmission liens to which it is connected; and
a plurality of terminating resistor elements having first ends connected with said second lines and second ends connected with a given voltage source and having a resistance equal tot he characteristic impedance of each of said second uniform transmission lines.

6. An analog-to-digital converter comprising:
a first line connected with an input terminal for receiving an analog signal to be analog-to-digital converted in which a specific characteristic impedance including that of said input terminal is maintained;
M second uniform transmission lines each having a first end connected with said first line and having N characteristic impedances, the resultant impedance of which is equal to the characteristic impedance of said first uniform transmission line;
M groups of comparators, each of the comparators having a comparing input terminal connected with a respective one of said M second lines and defining part of the distributed capacitance of the one of the M second uniform transmission lines to which it is connected; and
a plurality of terminating resistor elements having first ends connected with second ends of said M second uniform transmission lines and second ends connected with a given voltage source and having g a resistance equal to each of the characteristic impedances of said second uniform transmission lines.

7. An analog-to-digital converter comprising:
a first uniform transmission line connected with an input terminal for receiving an analog signal to be analog-to-digital converted in which a specific characteristic impedance including that of said input terminal is maintained;
N second lines each having a first end connected with said first uniform transmission lien and each having a characteristic impedance which is N times as high as the characteristic impedance of said first uniform transmission line;
a plurality of groups of comparators, each of the comparators having a comparing input terminal connected with a respective one of said N second uniform transmission lines and defining part of the distributed capacitance of the one of the N second uniform transmission liens to which it is connected;
a third uniform transmission line connected with second ends of said N second uniform transmission liens and having a characteristic impedance equal to that of said first uniform transmission line; and
an external terminating resistor having one end connected with said third uniform transmission line and another end connected with a given voltage source and having a resistance equal tot he characteristic impedance of said third uniform transmission line.

8. An analog-to-digital converter comprising:
a first uniform transmission line connected with an input terminal for receiving an analog signal to be analog-to-digital converted in which a specific characteristic impedance including that of said input terminal is maintained;
N second uniform transmission liens each having a first end connected with said first uniform transmission line and each having a characteristic impedance which is N timers as high as the characteristic impedance of said first uniform transmission line;
a plurality of groups of comparators, each of the comparators having a comparing input terminal connected with a respective one of said N second uniform transmission lines and defining par of the distributed capacitance of the one of the N second uniform transmission lines to which it is connected;
a third uniform transmission line connected with second ends of said N second uniform transmission liens and having a characteristic impedance equal to that of said first uniform transmission line; and
a terminating resistor element having one end connected with said third uniform transmission line and another end connected with a given voltage source and having a resistance equal to the characteristic impedance of said third uniform transmission line.

* * * * *